(12) United States Patent
Yang et al.

(10) Patent No.: US 11,908,910 B2
(45) Date of Patent: Feb. 20, 2024

(54) SEMICONDUCTOR DEVICE HAVING EMBEDDED CONDUCTIVE LINE AND METHOD OF FABRICATING THEREOF

(71) Applicant: Taiwan Semiconductor Manufacturing Company, Ltd., Hsinchu (TW)

(72) Inventors: Chih-Chuan Yang, Hsinchu (TW); Jing-Yi Lin, Hsinchu (TW); Hsin-Wen Su, Hsinchu (TW); Shih-Hao Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 636 days.

(21) Appl. No.: 16/949,363

(22) Filed: Oct. 27, 2020

(65) Prior Publication Data

US 2022/0130971 A1 Apr. 28, 2022

(51) Int. Cl.
*H01L 29/417* (2006.01)
*H01L 29/06* (2006.01)
*H01L 29/66* (2006.01)
*H01L 29/78* (2006.01)
*H01L 29/786* (2006.01)
*H01L 27/092* (2006.01)
(Continued)

(52) U.S. Cl.
CPC ............ *H01L 29/41791* (2013.01); *H01L 21/823431* (2013.01); *H01L 27/088* (2013.01); *H01L 27/0886* (2013.01); *H01L 27/092* (2013.01); *H01L 29/0653* (2013.01); *H01L 29/0673* (2013.01); *H01L 29/42392* (2013.01); *H01L 29/66545* (2013.01); *H01L 29/66818* (2013.01); *H01L 29/7851* (2013.01); *H01L 29/78696* (2013.01); *H10B 10/125* (2023.02)

(58) Field of Classification Search
CPC .......... H01L 29/41791; H01L 29/0653; H01L 29/66818; H01L 29/7851; H01L 29/775; H01L 27/092; H01L 27/1108; H01L 29/0673; H01L 29/42392; H01L 29/66545; H01L 29/78696; H01L 27/0886; H01L 27/0924; H01L 21/76224; H01L 21/76229; H01L 21/823481; H01L 21/823814; H01L 21/823821; H01L 21/823475; H01L 21/823878; H01L 21/823871; H01L 29/785; H01L 21/823431; H01L 27/088; H01L 29/66439; H10B 10/125; H10B 10/12; B82Y 10/00
See application file for complete search history.

(56) References Cited

U.S. PATENT DOCUMENTS 7,723,806 B2 * 5/2010 Liaw ...................... H10B 10/12
257/311
8,908,421 B2 * 12/2014 Liaw ..................... G11C 11/412
365/72

(Continued)

FOREIGN PATENT DOCUMENTS

EP 3454366 A1 * 3/2019 ........... H01L 21/743

*Primary Examiner* — Earl N Taylor
(74) *Attorney, Agent, or Firm* — Haynes and Boone, LLP

(57) ABSTRACT

Methods and devices that provide a first fin structure, a second fin structure, and a third fin structure disposed over a substrate. A dielectric fin is formed between the first fin structure and the second fin structure, and a conductive line is formed between the second fin structure and the third fin structure.

20 Claims, 25 Drawing Sheets

(51) Int. Cl.
*H01L 29/423* (2006.01)
*H10B 10/00* (2023.01)
*H01L 27/088* (2006.01)
*H01L 21/8234* (2006.01)

(56) References Cited

U.S. PATENT DOCUMENTS

| | | | |
|---|---|---|---|
| 10,074,558 B1* | 9/2018 | Tsai | H01L 21/823481 |
| 10,707,133 B2* | 7/2020 | St. Amour | H01L 21/3086 |
| 10,832,916 B1* | 11/2020 | Xie | H01L 21/823437 |
| 10,840,146 B1* | 11/2020 | Paul | H01L 29/66553 |
| 11,355,502 B2* | 6/2022 | Liaw | H01L 29/7853 |
| 2015/0370951 A1* | 12/2015 | Kawa | H10B 10/12 716/119 |
| 2017/0117411 A1* | 4/2017 | Kim | H01L 21/823814 |
| 2017/0194212 A1* | 7/2017 | Hung | H01L 29/165 |
| 2018/0090496 A1* | 3/2018 | Cheng | H01L 21/823431 |
| 2018/0108575 A1* | 4/2018 | Li | H01L 21/823821 |
| 2018/0254219 A1* | 9/2018 | Sun | H01L 21/823871 |
| 2019/0067478 A1* | 2/2019 | Chu | H01L 23/535 |
| 2019/0080969 A1* | 3/2019 | Tsao | H01L 23/5286 |
| 2019/0164809 A1* | 5/2019 | Meyer | H01L 21/823821 |
| 2019/0164846 A1* | 5/2019 | Leib | H10B 10/12 |
| 2019/0164890 A1* | 5/2019 | Yeoh | H01L 23/53266 |
| 2019/0165172 A1* | 5/2019 | Joshi | H01L 29/0653 |
| 2019/0334003 A1* | 10/2019 | Liang | H01L 29/42356 |
| 2020/0006075 A1* | 1/2020 | Wang | H01L 21/823481 |
| 2020/0035787 A1* | 1/2020 | Wang | H01L 23/535 |
| 2020/0058655 A1* | 2/2020 | Wang | H01L 27/0207 |
| 2020/0083116 A1* | 3/2020 | Demuynck | H01L 29/1054 |
| 2020/0168616 A1* | 5/2020 | Yang | H01L 27/092 |
| 2020/0212200 A1* | 7/2020 | Ghani | H01L 23/485 |
| 2020/0258778 A1* | 8/2020 | Lilak | H01L 27/0924 |
| 2020/0381291 A1* | 12/2020 | Huang | H01L 21/76224 |
| 2021/0082815 A1* | 3/2021 | Doornbos | H01L 27/11807 |
| 2021/0098473 A1* | 4/2021 | Lin | H01L 21/3065 |
| 2021/0202498 A1* | 7/2021 | Liaw | H01L 29/0673 |
| 2021/0280708 A1* | 9/2021 | Wei | H01L 27/0886 |
| 2021/0408000 A1* | 12/2021 | Lin | H01L 29/7851 |
| 2021/0408012 A1* | 12/2021 | Keng | H01L 21/823878 |
| 2022/0037535 A1* | 2/2022 | Yang | H01L 21/823871 |
| 2022/0130971 A1* | 4/2022 | Yang | H01L 29/66545 |
| 2022/0367483 A1* | 11/2022 | Yang | H01L 29/66439 |

* cited by examiner

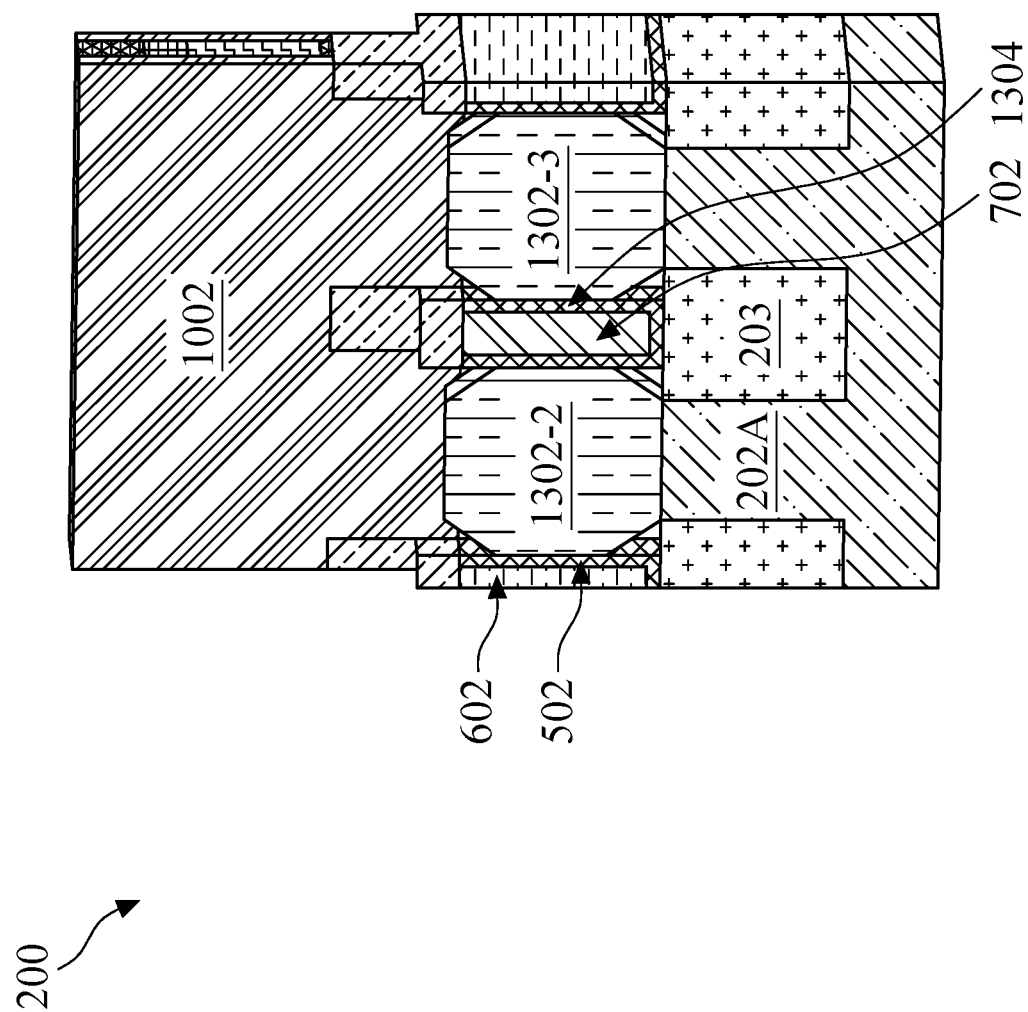

SEMICONDUCTOR DEVICE HAVING EMBEDDED CONDUCTIVE LINE AND METHOD OF FABRICATING THEREOF

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) are one example of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). Another multi-gate device type includes surrounding gate transistor (SGT) or a gate-all-around (GAA) transistor where its gate structure surrounds the channel regions. The channel region of a GAA transistor may be formed from nanowires, nanosheets, or other nanostructures and for that reasons, this transistor may also be referred to as a nanowire transistor or a nanosheet transistor.

One challenge of the scaling down of devices is maintaining adequate performance from the scaled down features. For example, as processes are scaled down interconnect lines become smaller and smaller. Smaller interconnect lines can exhibit greater resistance, which can impact the device performance. Therefore, while conventional methods of forming devices be generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 10A, 13B, and 14A illustrate fragmentary perspective views associated with the fabrication process according to the method of FIG. 1, according to one or more aspects of the present disclosure.

DETAILED DESCRIPTION

Figure 1:
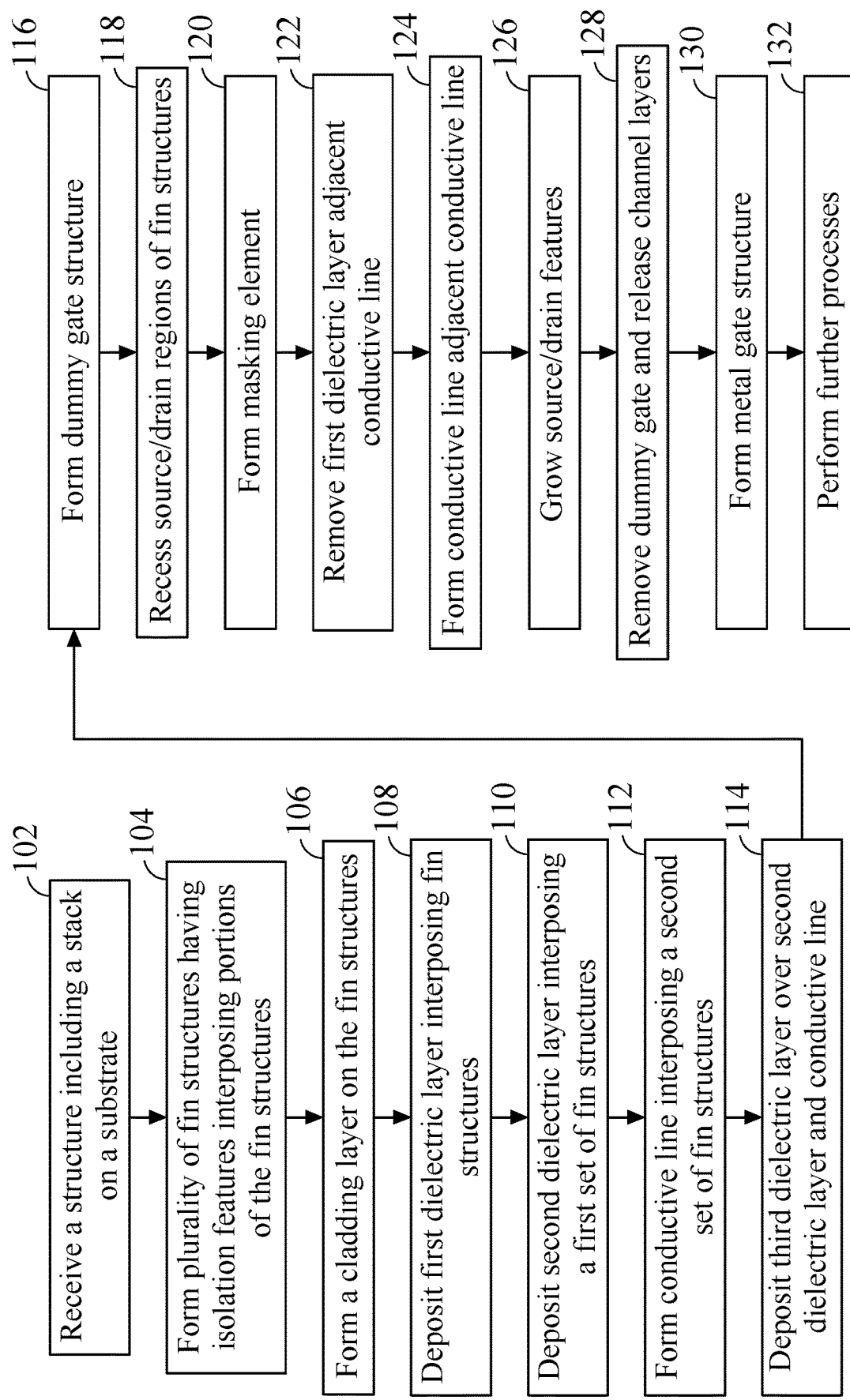
FIG. 1 illustrates a flowchart of a method for forming a semiconductor device, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

As described above, multi-gate transistors may also be referred to as FinFETs, SGTs, GAA transistors, nanosheet transistors, or nanowire transistors. They can be either n-type or p-type. While the implementations discussed herein refer to GAA transistors, it is important to note that the disclosure is also applicable to other device configurations, including but not limited to FinFET devices. For example, fin structures 212 discussed below as being directed to forming a GAA device having an alternating stack of channel and sacrificial layer, may alternatively be fin structures of a FinFET device (e.g., silicon fin).

The present disclosure is generally related to methods and devices that provide for an interconnect line to formed in an area that is between active regions extending above the substrate, for example, between and coplanar with source/drain features and between and/or coplanar with gate structures. This is referred to the conductive line being embedded in the device.

The present disclosure recognizes that while shrinking devices, metallization layers carrying signal and/or power to and from the transistor or components thereof are becoming smaller and thus, increasing in resistance. For some device types this increased resistance can be detrimental to the device performance. For example, shrinking an SRAM cell means the SRAM power lines increase in resistance. For the SRAM devices, Vccmin is the lowest voltage required to maintain SRAM operation. With the shrinking of metallization layers, including the power line carrying Vcc, the resistance of the line is increasing. This increased resistance may impact the voltage, Vcc, because of the larger IR drop. Vccmin can then increase and/or the SRAM operation (e.g., read or write) fail. For example, in some embodiments, the metallization line farthest from the cell can drop so significantly that an SRAM operation (e.g., write) can fail.

Figure 15A:
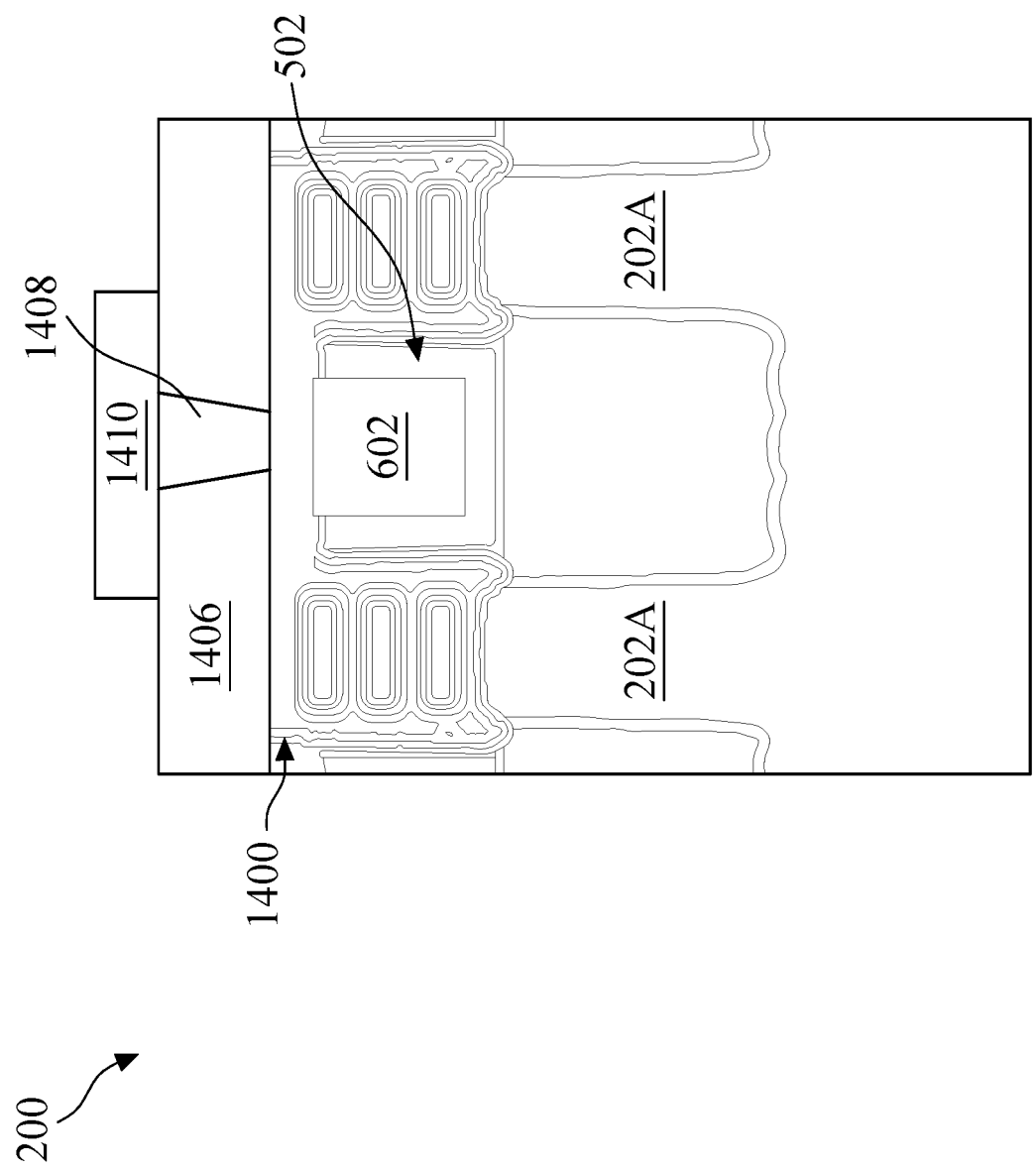

The process and structure of the present disclosure enables improvement in performance of device structures including, for example, enabling shrinking and/or improvement of performance of a standard cell. As discussed above, certain embodiments discussed herein are illustrated by way of a GAA transistor, however, it will be appreciated that the methods and structures discussed herein can also be applied to other structures such as, fin structures of FinFETs. Further, discussed below is an implementation of certain aspects of the present disclosure with respect to an SRAM device (see, e.g., FIG. 15), however, other device types may also benefit from aspects of the disclosure.

The embedded metallization lines discussed herein may be suitable for carrying power or other signal to and from devices on a substrate may be formed in one or more locations on the substrate. In some embodiments discussed below, the metallization line is formed such that contact is made to the device at the source/drain regions of transistors. In some embodiments discussed below, the metallization line is formed such that contact is made at or adjacent a gate structure in a dummy region of the IC. The gate structure in the dummy region may provide for conductive path for the connection to the metallization line but is not a functional gate of a functional transistor. These configurations to the source/drain of a transistor and to the gate of a dummy device may be used together for a single metallization line (e.g., Vdd or Vss) as it is routed across the wafer, or a single one of these metallization lines and contacts for said single metallization line may be used as it is routed across the wafer. In other words, the metallization line between and coupled to source/drain features may be implemented independently. The metallization line between and coupled to gate structures in a dummy region may be implemented independently.

Figure 9A:
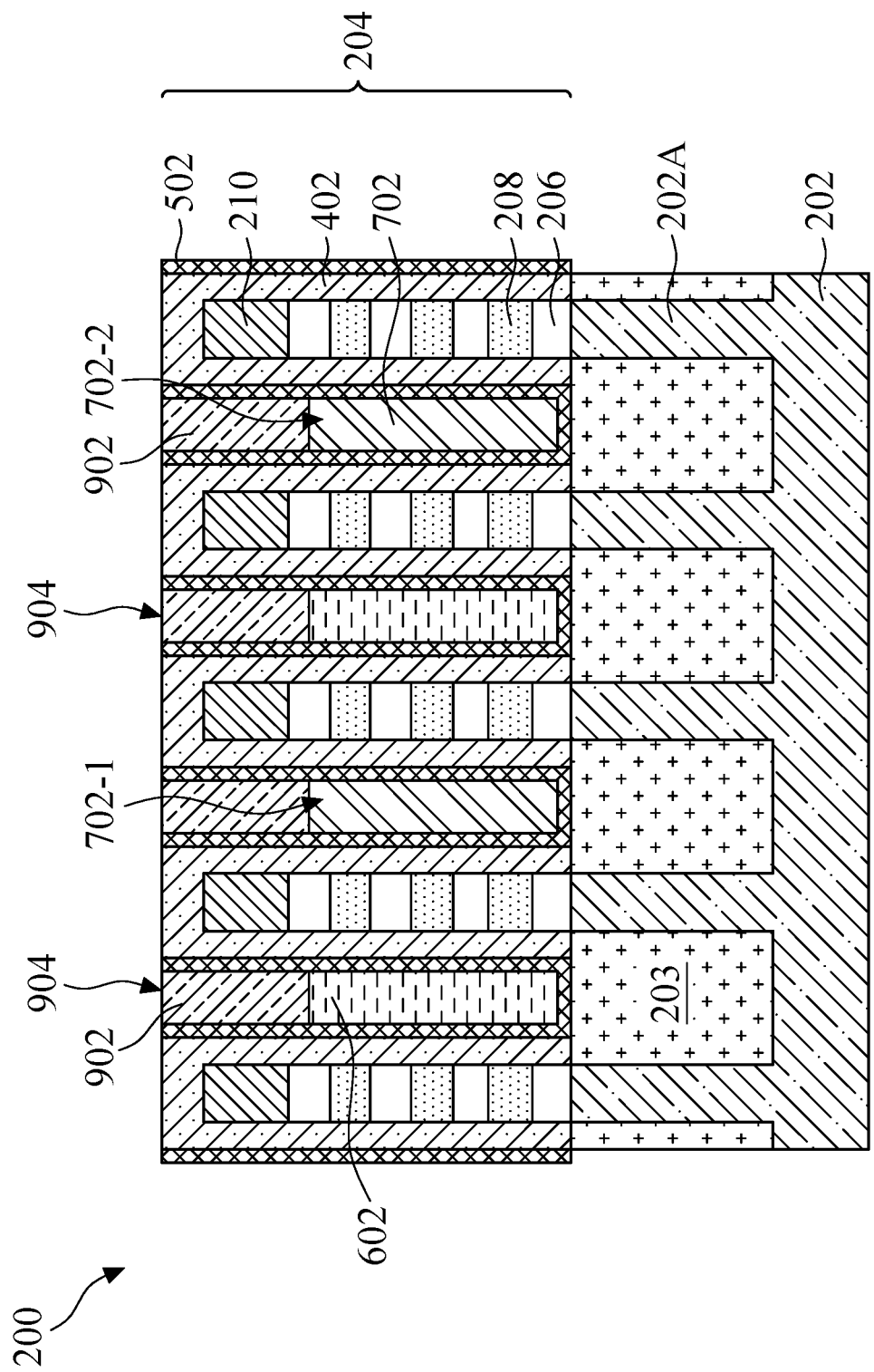
Figure 9B:
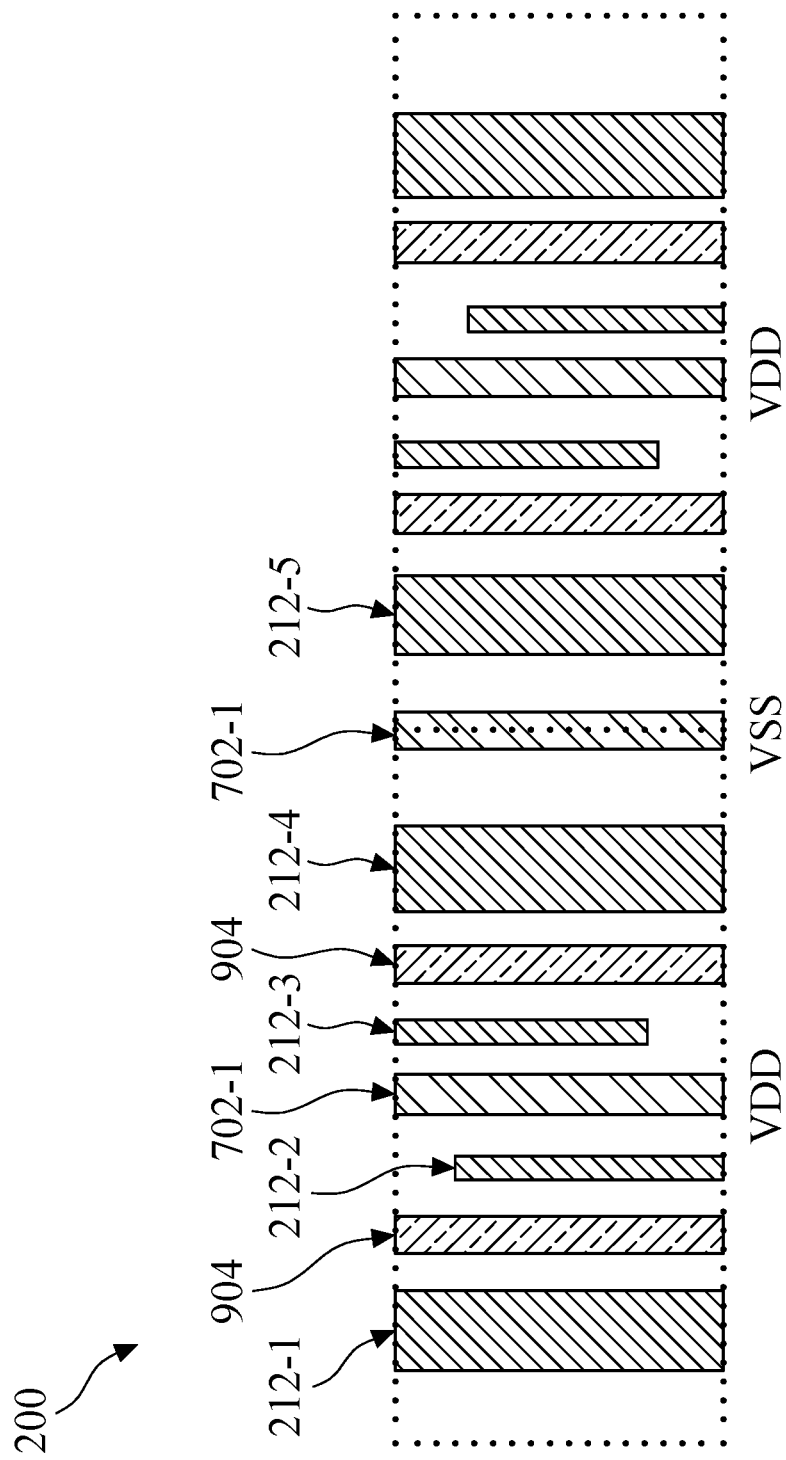
FIGS. 9B, 10C, 14B and 15C illustrate fragmentary top view of a layout associated with the fabrication process according to the method of FIG. 1, according to one or more aspects of the present disclosure.
Figure 10A:
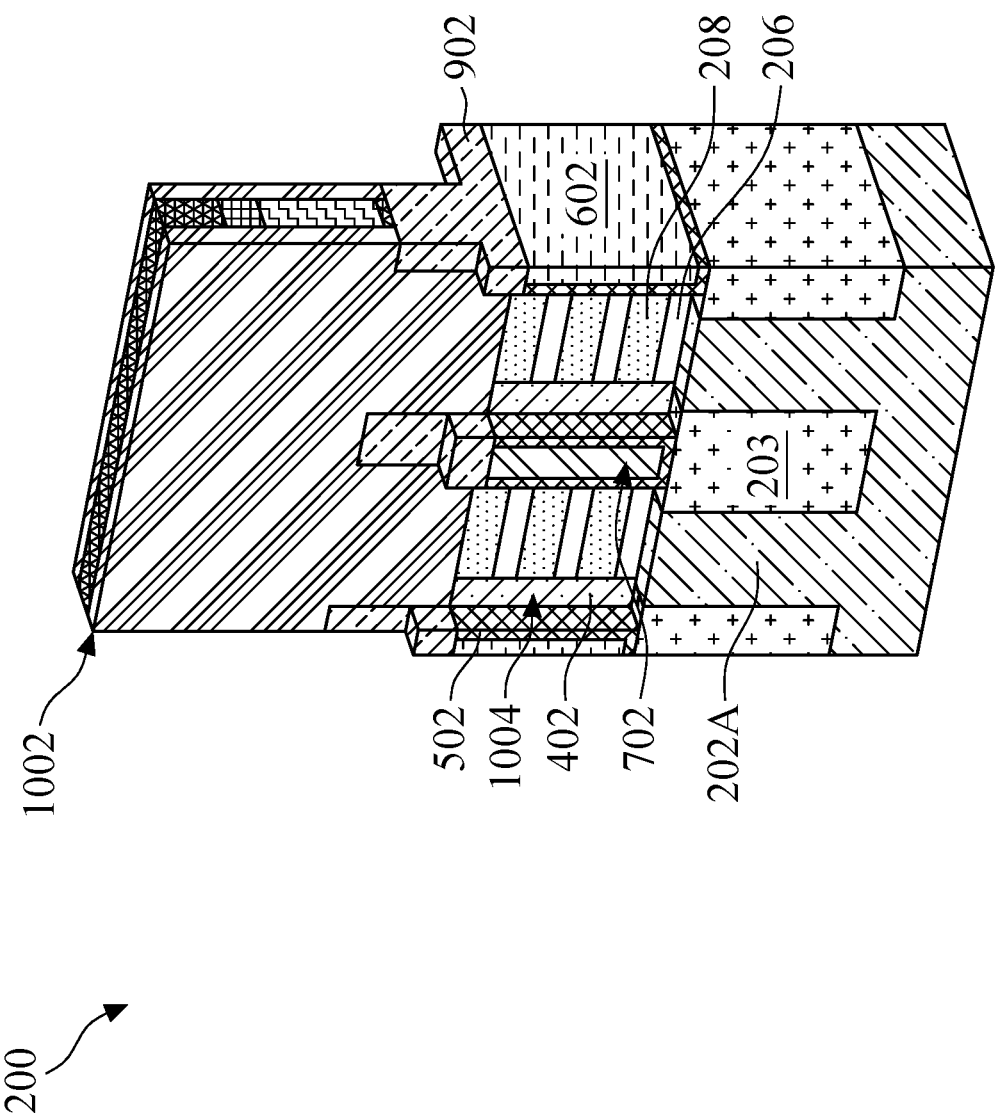
Figure 10B:
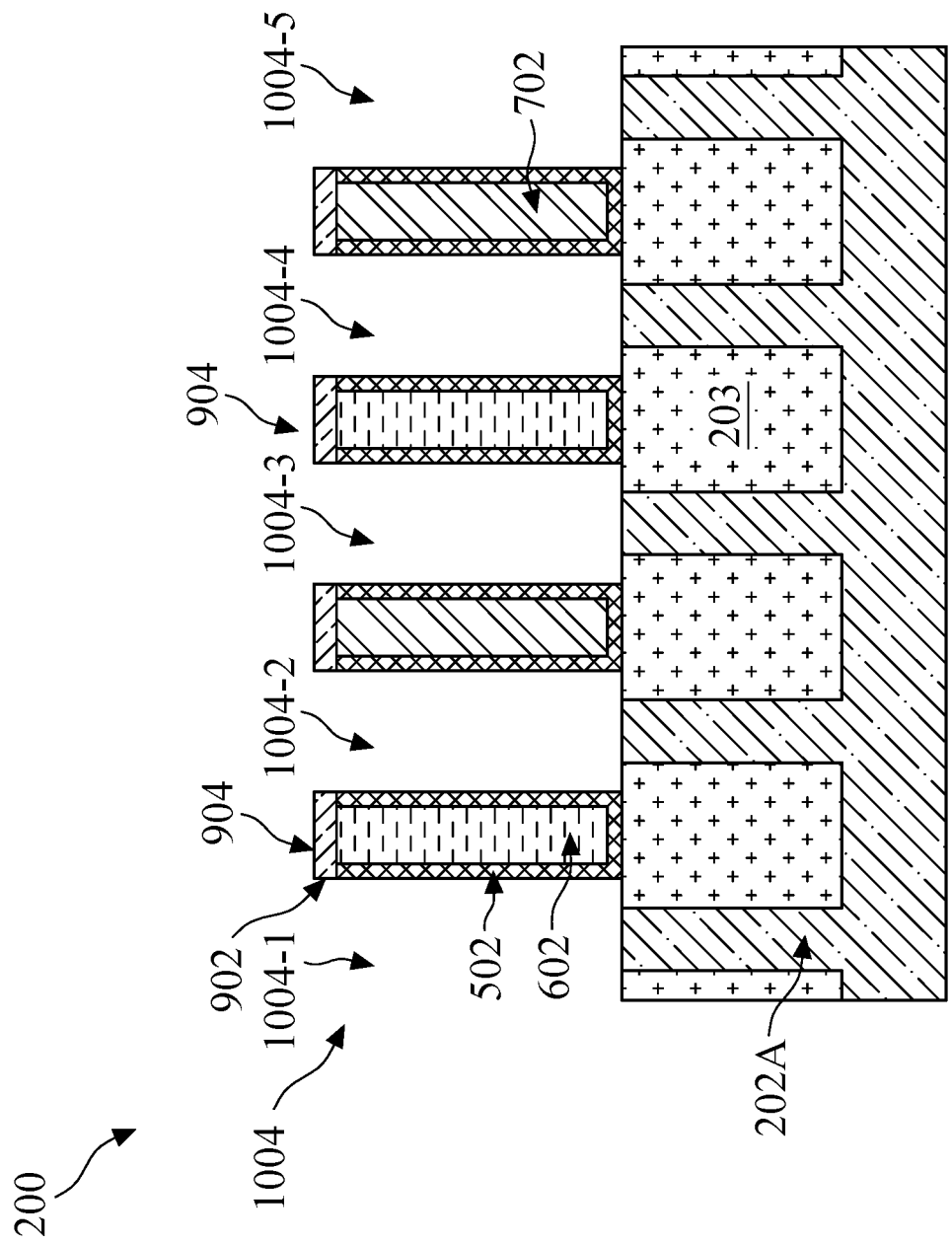
Figure 12A:
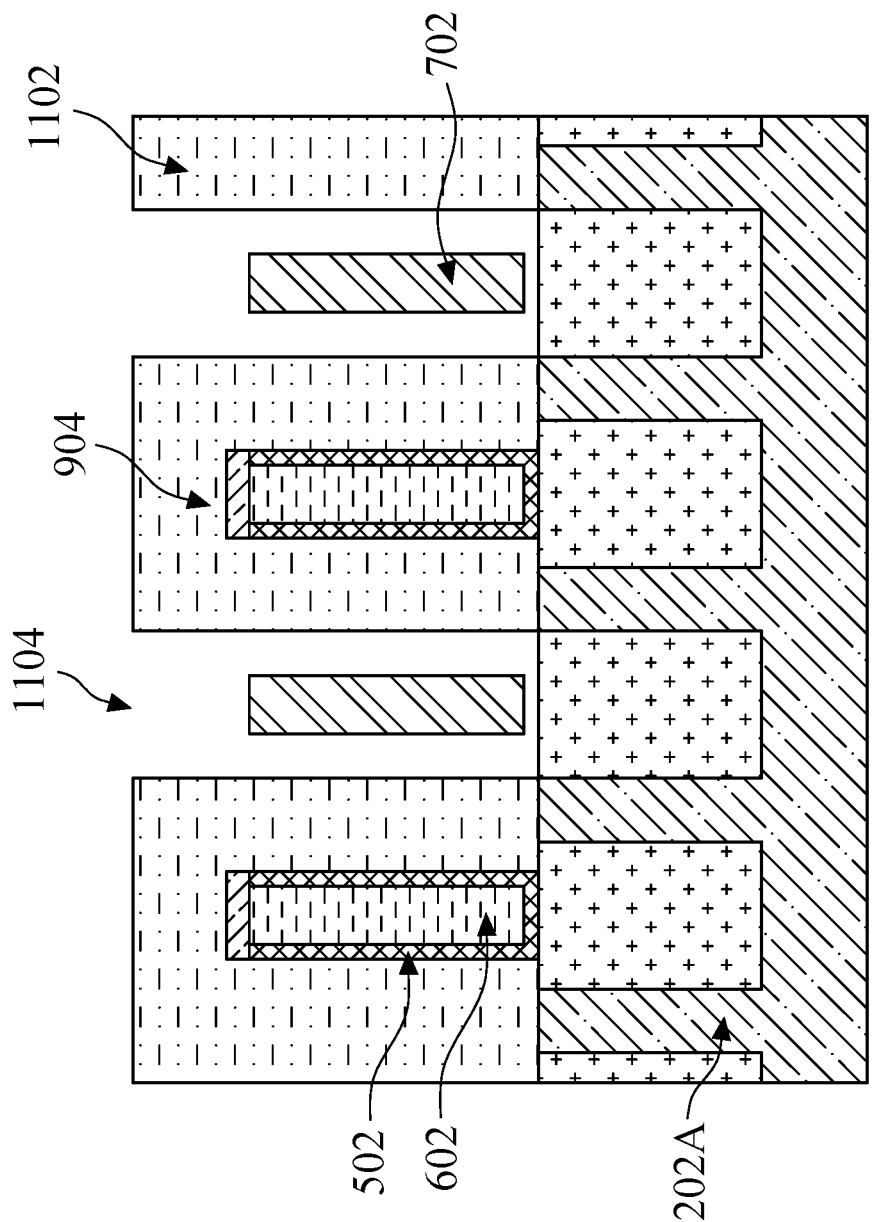
Figure 12B:
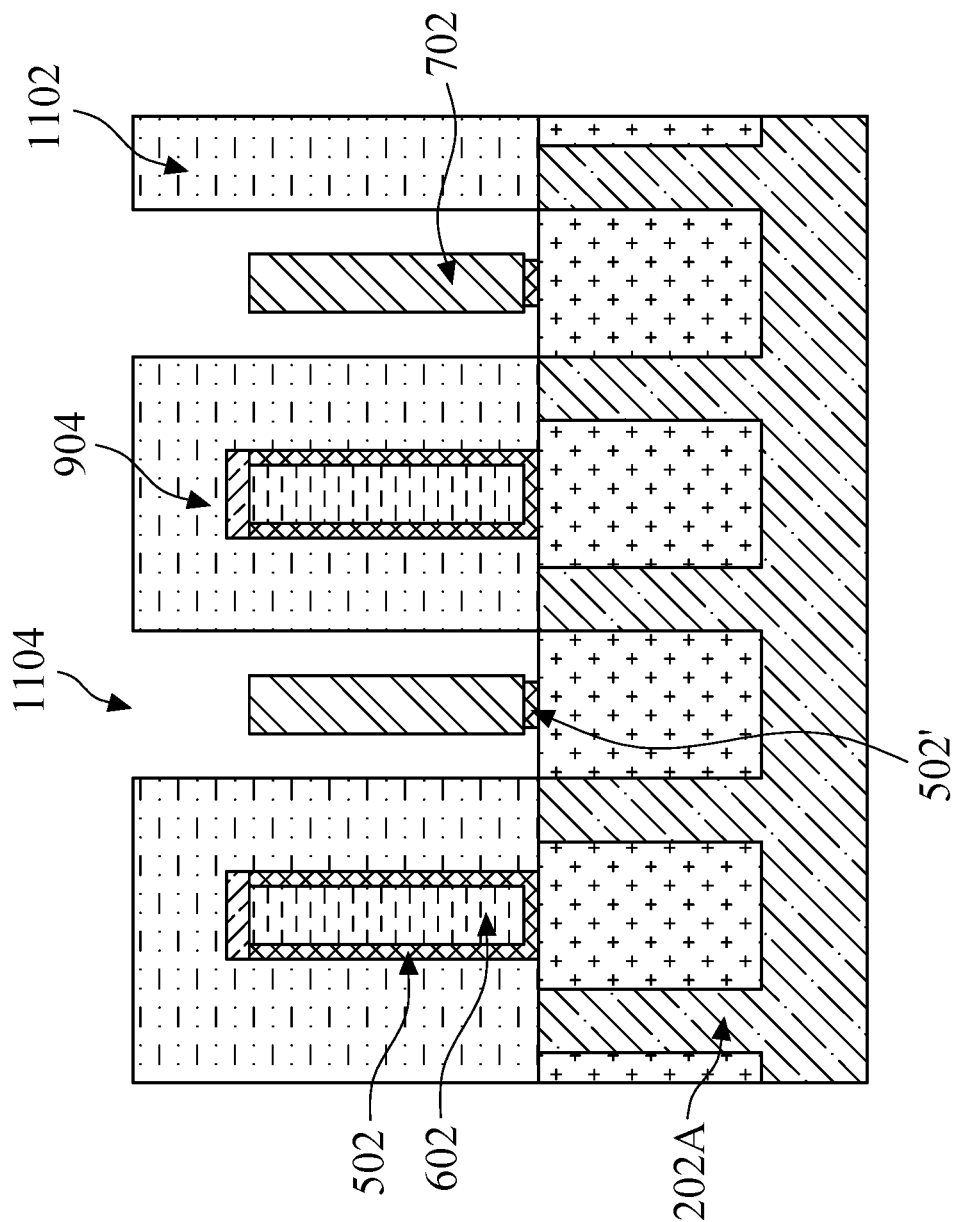
FIGS. 12B and 13C illustrate fragmentary cross-sectional views of a variation of the structure during a fabrication process according to the method of FIG. 1, according to one or more aspects of the present disclosure.
Figure 13A:
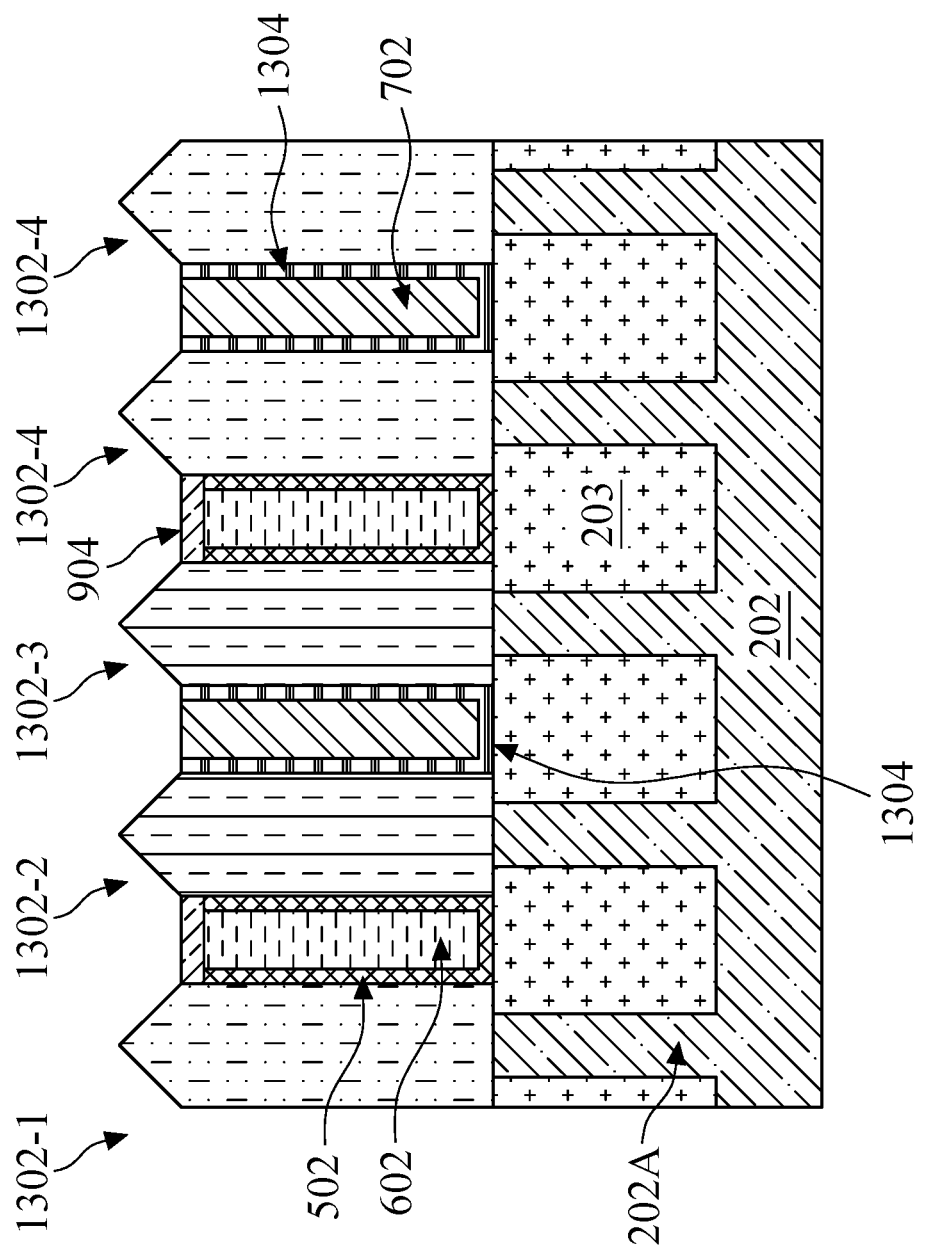
Figure 14A:
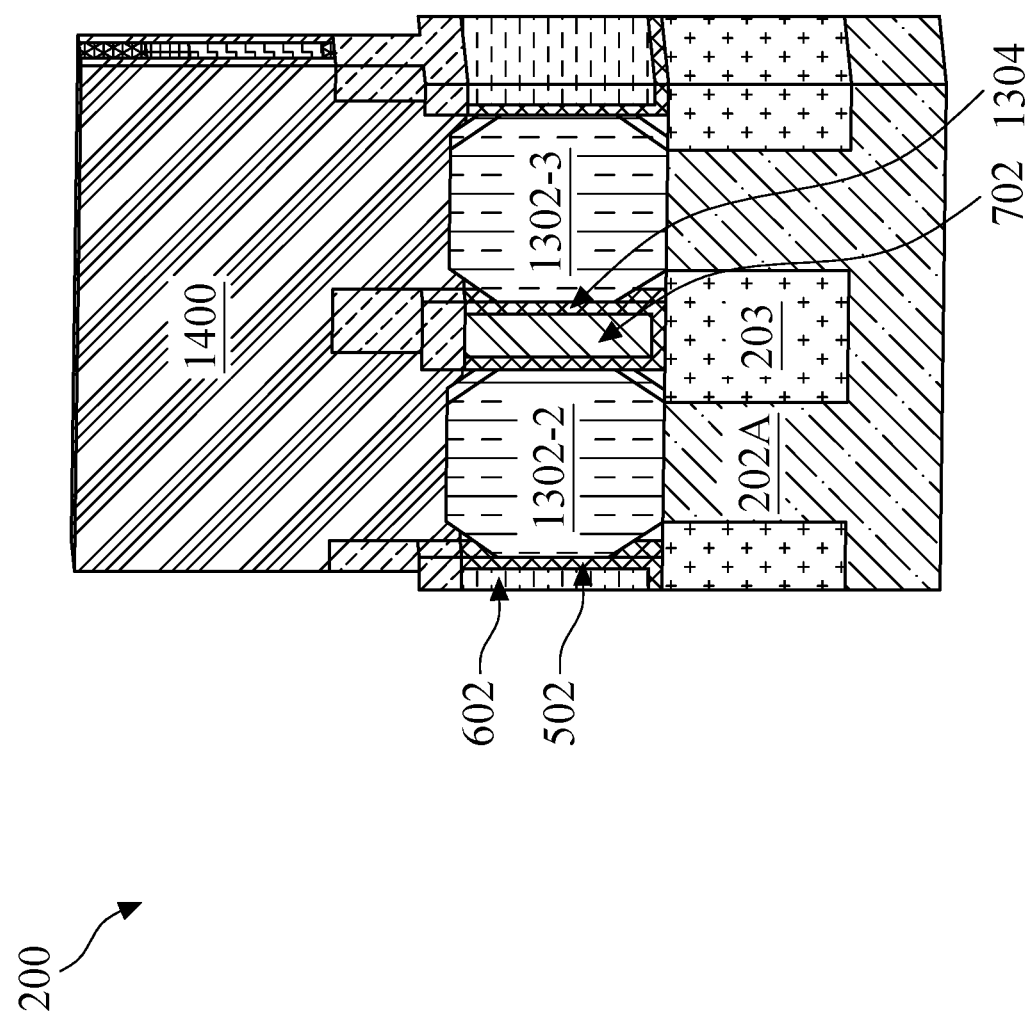

Referring now to FIG. 1, illustrated is a method 100 for fabricating a semiconductor device 200, a fragmentary cross-sectional view of which is illustrated in FIGS. 2, 3, 4, 5, 6, 7, 8, 9A, 10B, 11, 12, 13A, 15A, and 15B, a fragmentary perspective view is illustrated in FIGS. 10A, 13B, and 14A and fragmentary top views of an associated layout of which is illustrated in FIGS. 9B, 10C, 14B and 15C. Method 100 is exemplary only and is not intended to limit the present disclosure to what is explicitly illustrated therein. Additional steps can be provided before, during, and after method 100, and some steps described can be replaced, eliminated, or moved around for additional embodiments of the method. Not all steps are described herein in detail for reasons of simplicity. Besides what are explicitly shown in figures of the present disclosure, the semiconductor device 200 may include additional transistors, bipolar junction transistors, resistors, capacitors, diodes, fuses, etc. Throughout the present disclosure, like reference numerals denote like features unless otherwise excepted or described.

The method 100 begins at block 102 where a substrate is received. Referring to the example of FIG. 2, a substrate 202 is provided. In an embodiment, the substrate 202 may be a silicon (Si) substrate. In some other embodiments, the substrate 202 may include other semiconductors such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 202 may also include an insulating layer, such as a silicon oxide layer, to have a silicon-on-insulator (SOI) structure or a germanium-on-insulator (GOI) structure. In some embodiments, the substrate 202 may include one or more well regions, such as n-type well regions doped with an n-type dopant (i.e., phosphorus (P) or arsenic (As)) or p-type well regions doped with a p-type dopant (i.e., boron (B)), for forming different types of devices. The doping the n-type wells and the p-type wells may be formed using ion implantation or thermal diffusion.

Figure 2:
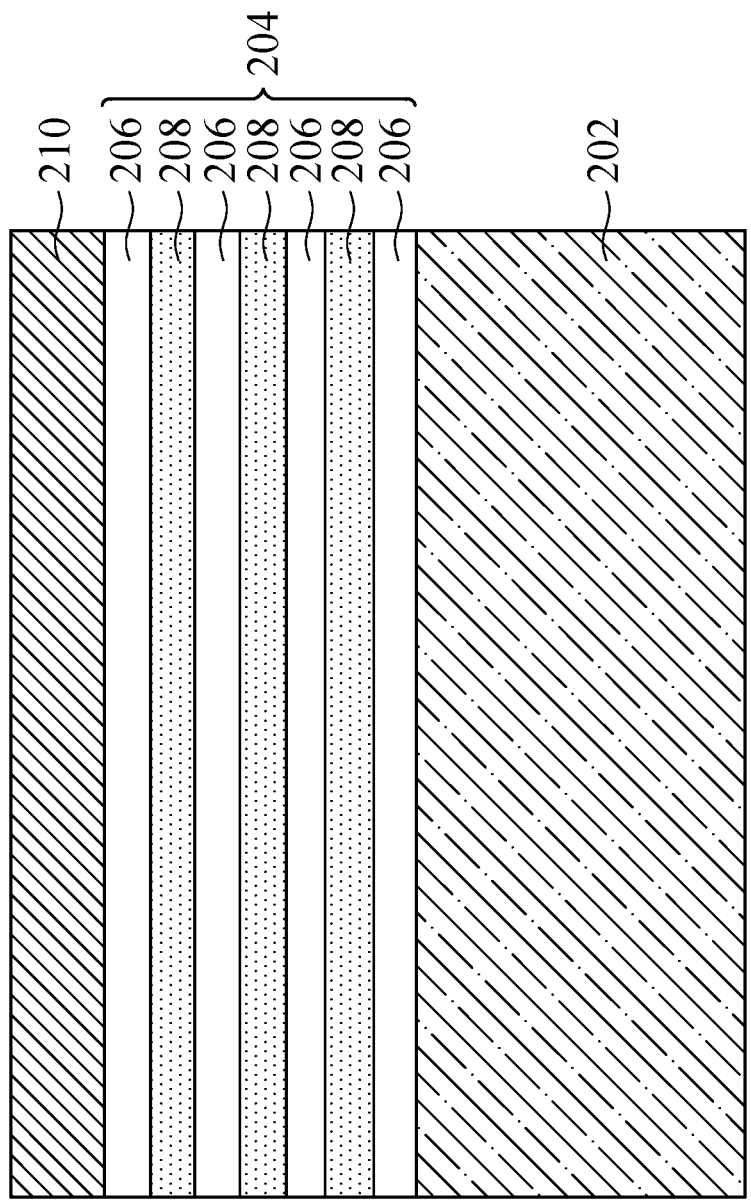
FIGS. 2, 3, 4, 5, 6, 7, 8, 9A, 10B, 11, 12A, 13A, 15A, and 15B illustrate fragmentary cross-sectional views of a structure during a fabrication process according to the method of FIG. 1, according to one or more aspects of the present disclosure.

Referring still to FIG. 2, a stack 204 may be disposed on the substrate 202. The stack 204 may include a plurality of channel layers 208 interleaved by a plurality of sacrificial layers 206. The channel layers 208 and the sacrificial layers 206 may have different semiconductor compositions. The sacrificial layers 206 and the channel layers 208 are deposited alternatingly, one-after-another, to form the stack 204. In some implementations, the channel layers 208 are formed of silicon (Si) and sacrificial layers 206 are formed of silicon germanium (SiGe). In some implementations, the additional germanium content in the sacrificial layers 206 allow selective removal or recess of the sacrificial layers 206 without substantial damages to the channel layers 208, as discussed below. In some embodiments, the stack 204 including the sacrificial layers 206 and the channel layers 208 may be formed using an epitaxial process to deposit the materials. Exemplary techniques include but are not limited to CVD deposition techniques (e.g., vapor-phase epitaxy (VPE) and/or ultra-high vacuum CVD (UHV-CVD)), molecular beam epitaxy (MBE), and/or other suitable processes. It is noted that four (4) layers of the sacrificial layers 206 and three (3) layers of the channel layers 208 are alternately and vertically arranged as illustrated in FIG. 2. However, this is for illustrative purposes only and not intended to be limiting beyond what is specifically recited in the claims. The number of layers depends on the desired number of channels members for the semiconductor device 200. In some embodiments, the number of the channel layers 208 is between 2 and 10. For patterning purposes, a hard mask layer 210 may be disposed over the stack 204. The hard mask layer 210 may be a single layer or a multilayer. In one implementation, the hard mask layer 210 includes a silicon oxide layer and a silicon nitride layer.

The method 100 then proceeds to block 104 where a plurality of fin structures is formed. In some implementations, isolation features are formed interposing the fin structures, for example, at the lower region of the fin structures. Each of the fin structures defines an active region on the substrate. Referring to the example of FIG. 3, fin structures 212 are formed. While five (5) fin structures are shown, this is for illustrative purposes only and not intended to be limiting beyond what is specifically recited in the claims.

The fin structures 212 may be fabricated using suitable processes including photolithography and etch processes. The photolithography process may include forming a photoresist layer overlying the substrate 202, exposing the photoresist layer to a pattern, performing post-exposure bake processes, and developing the photoresist layer to form a masking element including the photoresist layer. In some embodiments, the masking element further includes the hard mask layer 210. In some embodiments, patterning the photoresist layer to form the masking element may be performed using an electron beam (e-beam) lithography process. As technologies nodes decrease, the fin structures 212 may be patterned using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The material layer is then removed, and the remaining spacers, or mandrels, may then be used to pattern the fin structures.

The masking element(s) described above may then be used to protect regions of the stack 204 and/or substrate 202 while the fin structures 212 are etched. The recesses may be etched using a dry etch (e.g., chemical oxide removal), a wet etch, reactive ion etching (RIE), and/or other suitable processes. Numerous other embodiments of methods to form the fin structures 212 on the substrate 202 may also be used.

Figure 3:
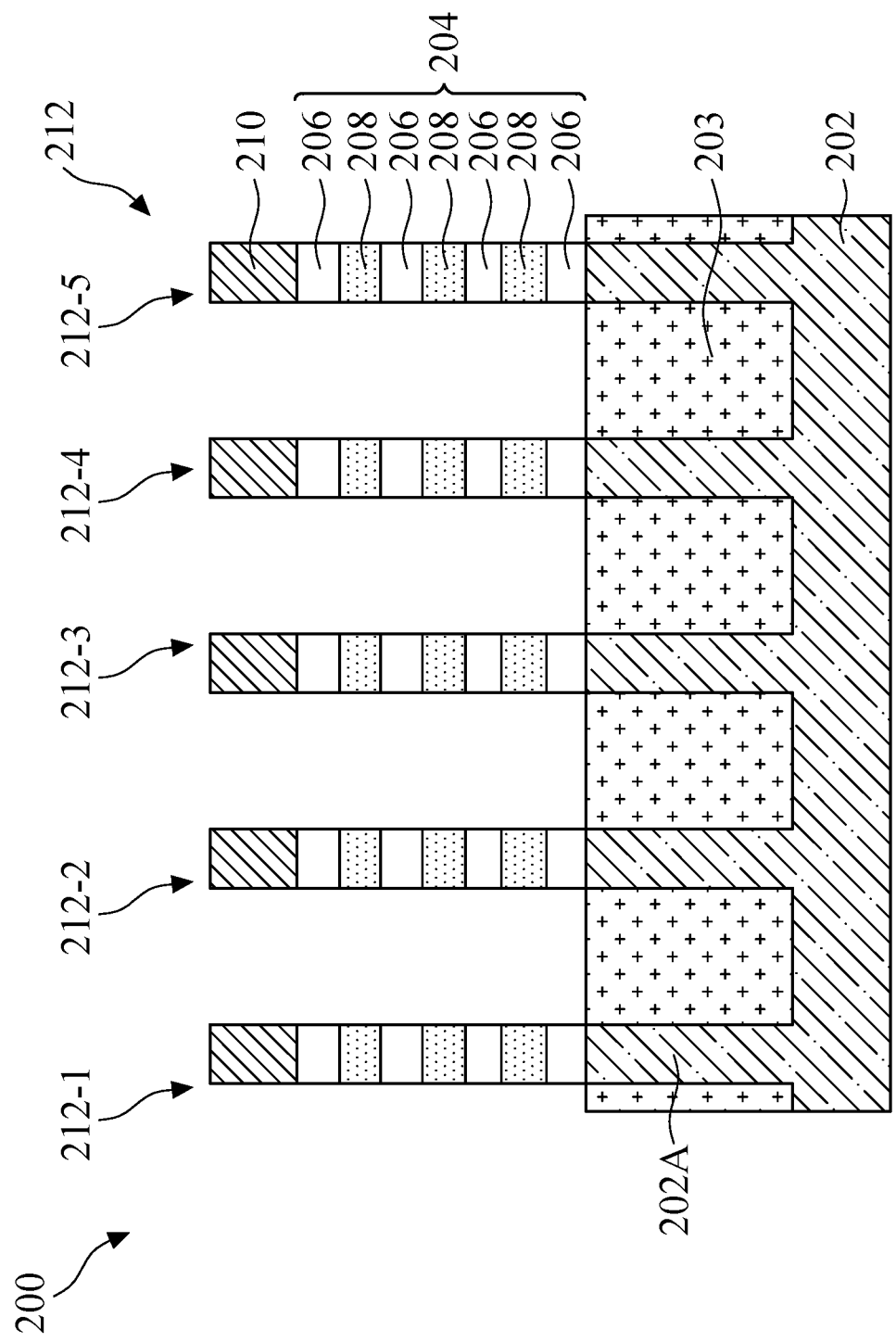
Figure 4:
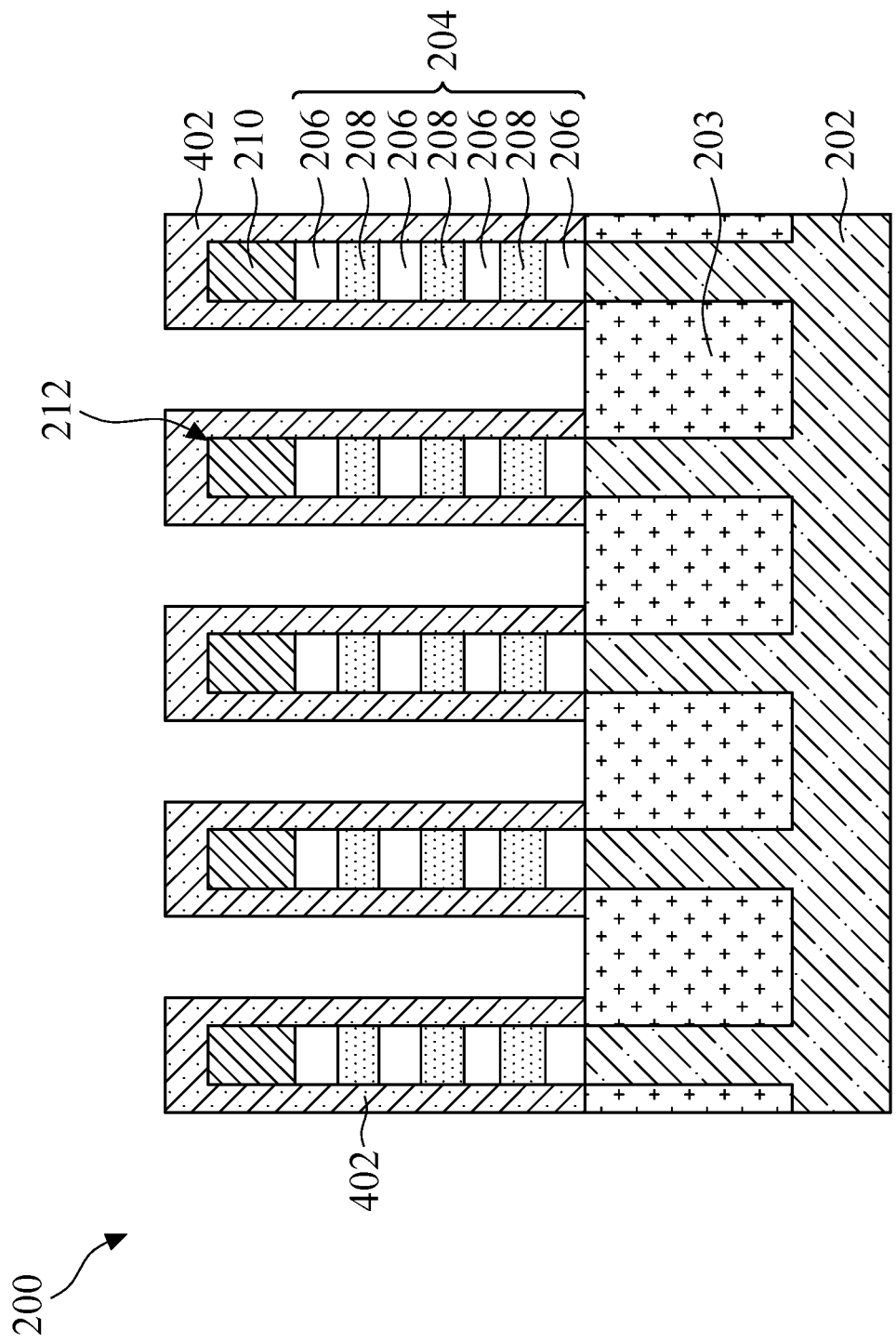
Figure 5:
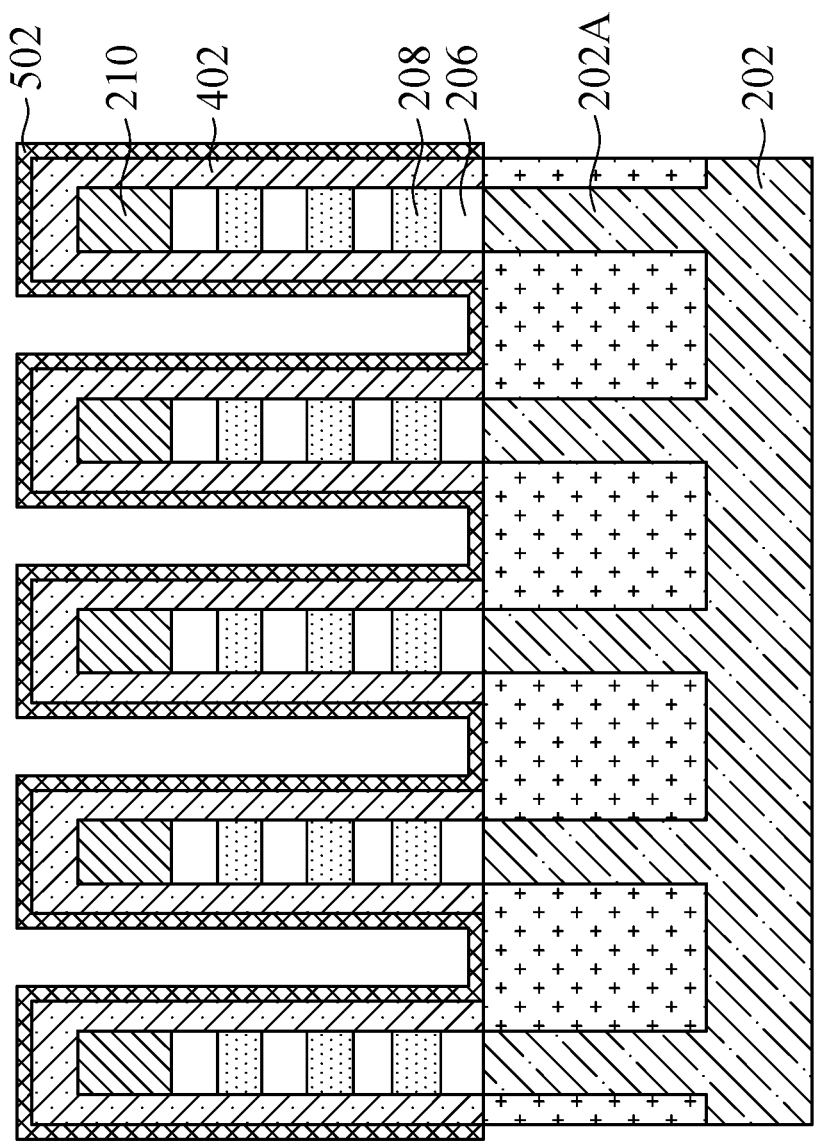
Figure 6:
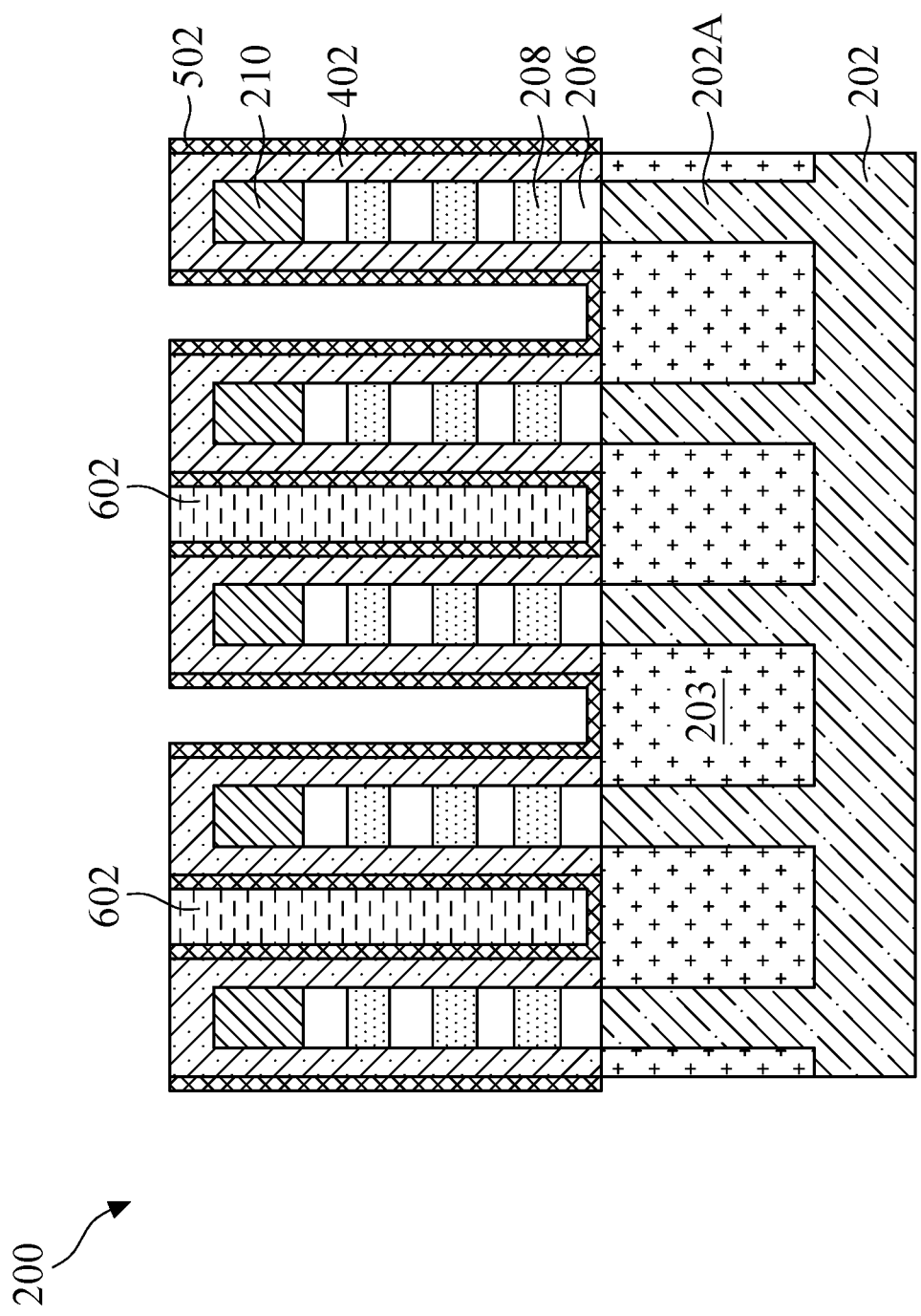

The fin structures 212 extend vertically (Y-direction) above the substrate 202 and length-wise along the Z direction from the substrate 202 (e.g., into the page of FIG. 3). Each of the fin structures 212 includes a base portion formed from the substrate 202, annotated as 202A, and an overlying portion formed of materials of the stack 204. The fin structures 212 are each spaced a distance in the X-direction from a neighboring fin structure. In an embodiment, the first fin 212-1 is designed to form an NFET device, the next two fins 212-2 and 212-3 are designed to form a PFET device, and the following two fins 212-4 and 212-5 designed to form NFET devices. However, other configurations are possible.

Continuing to refer to the example of FIG. 3, isolation features 203, also referred to as shallow trench isolation (STI) features, are formed interposing the fin structures 212. The isolation features 203 interpose the fin structures at a bottom region. The isolation features 203 may include dielectric material that is first deposited over the substrate 202, filling the trenches between the fin structures 212 with the dielectric material. In some embodiments, the dielectric material may include $SiO_2$, silicon nitride, silicon oxynitride, fluorine-doped silicate glass (FSG), a low-k dielectric, combinations thereof, and/or other suitable materials known in the art. In various examples, the dielectric material may be deposited by a CVD process, a subatmospheric CVD (SACVD) process, a flowable CVD process, an ALD process, a PVD process, or other suitable process. The isolation features 203 may include a multi-layer structure. After deposition of the insulating material(s) of the isolation features 203, a chemical mechanical planarization process may be performed followed by an etch back process that provides an upper portion of the fin structures 212 extending above a top surface of the isolation features 203. In some embodiments, a field oxide, a LOCOS feature, and/or other suitable isolation features may additionally or alternatively be implemented on and/or within the substrate.

The method 100 then proceeds to block 106 where a cladding layer is formed over the fin structure. The cladding layer may be formed over each fin structure. Referring to the example of FIG. 4, a cladding layer 402 is formed on each fin structure 212. In some embodiments, the cladding layer 402 may have a composition similar to that of the sacrificial layers 206. In some implementations, the cladding layer 402 is likewise a sacrificial layer. In an embodiment, the cladding layer 402 is formed of silicon germanium (SiGe). In some implementations, the cladding layer 402 and the sacrificial layers 206 include a composition that allows selective removal of the sacrificial layers 206 and the cladding layer 402 during the release of channel layers 208 in a subsequent process by a single etchant, discussed below. In an embodiment, the cladding layer 402 may be epitaxially grown using vapor phase epitaxy (VPE), molecular bean epitaxy (MBE), or other suitable process. In an embodiment, the cladding layer 402 is formed by a deposition process such as CVD process, a subatmospheric CVD (SACVD) process, a flowable CVD process, an ALD process, a PVD process, or other suitable process. After deposition, in some embodiments, operations at block 106 may include etch back processes to remove material of the cladding layer 402, for example conformally deposited, from on the isolation feature 203. In some embodiments, the thickness of the cladding layer 402 is between approximately 9 and approximately 12 nm.

The method 100 may then proceed to block 108 where the method provides for depositing a first dielectric layer on the fin structures thereby lining the opening between adjacent fin structures. The first dielectric layer is one of a plurality of layers that forms a separation structure, also referred to as a dielectric fin, between adjacent active regions, which is further discussed below. Referring to the example of FIG. 5, a first dielectric layer 502 is deposited. In some embodiments, the first dielectric layer 502 may include a high-k dielectric. In an embodiment, the first dielectric layer 502 may be silicon nitride, silicon carbonitride (SiCN), silicon oxycarbonitride (SiOCN), or combinations thereof. In some embodiments, dielectric layer 502 includes $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$, (Ba, Sr)$TiO_3$, $HfO_2$—$Al_2O_3$, other suitable high-k dielectric material, or combinations thereof. The first dielectric layer 502 may be deposited using CVD, ALD, or other suitable process(es).

The method 100 may then proceed to block 110 where a second dielectric layer is formed over the first dielectric layer and interposing a first set of fin structures. Referring to the example of FIG. 6, a dielectric layer 602 is formed interposing fins 212-1 and 212-2 and also interposing fins 212-3 and 212-4. The dielectric layer 602 may be omitted from between neighboring fins 212-2 and 212-3 and between neighboring fins 212-4 and 212-5. In an embodiment, fins 212-2 and 212-3 provide a first device type (e.g., PFET) and the fins 212-4 and 212-5 provide a second device (e.g., NFET).

In some embodiments, the dielectric layer 602 may be an oxide composition. The dielectric layer 602 formed using a flowable chemical vapor deposition (CVD) process and/or other process providing suitable gap-filling techniques such as a high aspect ratio deposition (HARP) process. In some implementations, the flowable oxide material may be deposited in a liquid state allowing it to flow into the trenches between the fins 212. In some embodiments, the oxide includes a suitable material including silicon and oxygen.

The oxide material may be cured such as by anneal and/or UV radiation. In some implementations, the deposition process overfills the illustrated trenches. After deposition, a planarization process such as chemical mechanical polish (CMP), may be performed. In an embodiment, the cladding layer 402 provides a suitable etch stop for such planarization.

In some implementations, the spacing between neighboring fins 212-2 and 212-3 and between neighboring fins 212-4 and 212-5 may be covered with a masking layer (not shown) during the formation of the layer 602 to prevent formation of the dielectric layer 602 in the selected spaces. The masking layer may be subsequently removed. In another implementation, the dielectric layer 602 may be initially deposited between neighboring fins 212-2 and 212-3 and between neighboring fins 212-4 and 212-5, and subsequently removed by a suitable etching process.

The method 100 then proceeds to block 112 where a conductive line is formed interposing a second set of fin structures. In an embodiment, the conductive line may be formed between two fin structures designed for respective active regions of a same type of transistor (e.g., NFET or PFET). The conductive line may be formed in openings between fins where the second dielectric layer of block 110 was not formed. In some embodiments, block 112 is performed prior to block 110, for example, the conductive line being patterned between a second set of fin structures, and subsequently the dielectric layer of block 110 is formed between the remaining fin structures.

Figure 7:
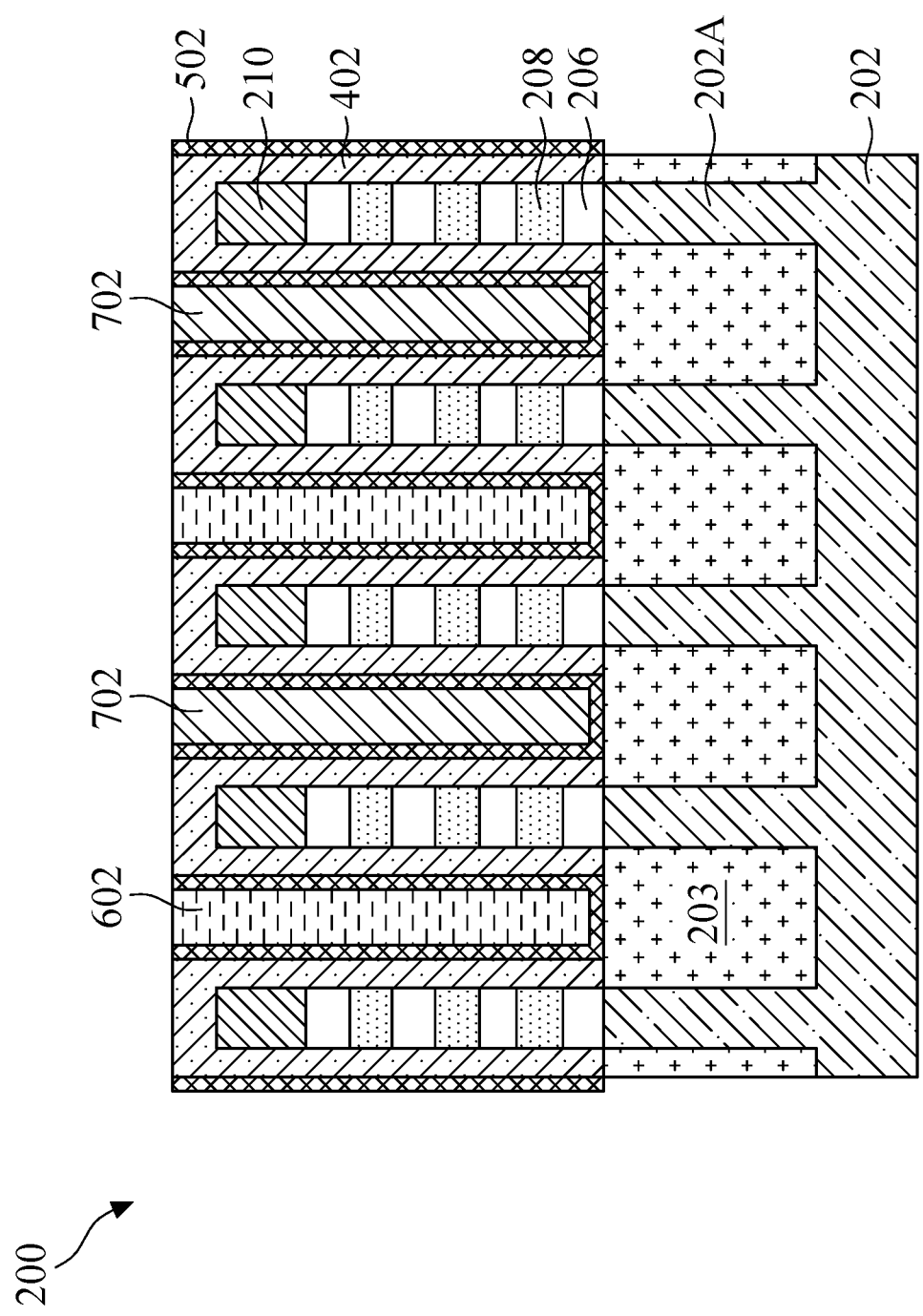
Figure 8:
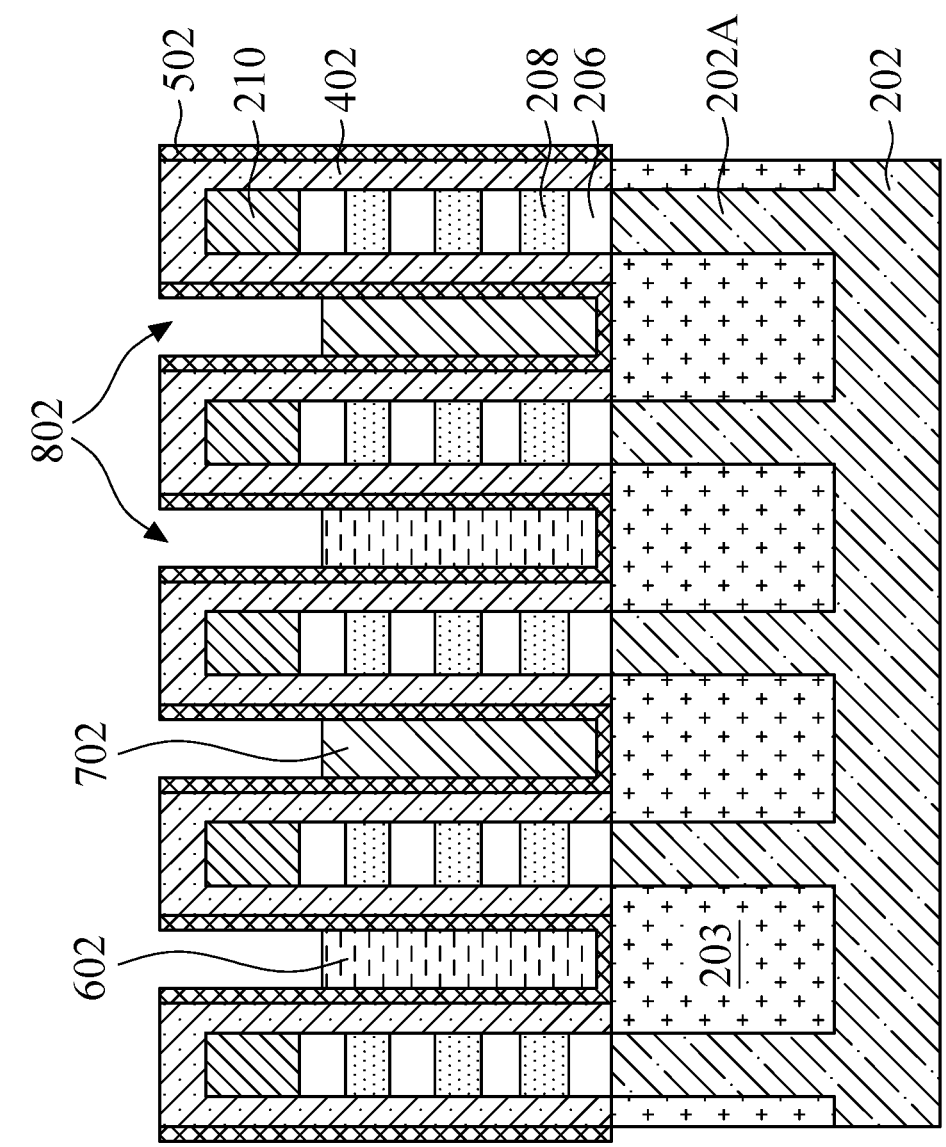

Referring to the example of FIG. 7, a conductive line 702 is formed over the first dielectric layer 502 between fins 212-2 and 212-3 and between fins 212-4 and 212-5 respectively. The conductive line 702 may include tungsten, ruthenium, cobalt, tantalum, titanium, copper, combinations thereof, and/or other suitable materials. The conductive line 702 may include a multi-layer structure. In some embodiments, the conductive material(s) forming the conductive line 702 is deposited over the substrate overfilling the spacing between fins 212. Following deposition, the device may be planarized removing the conductive material over the fins 212. The conductive material may be deposited by ALD, plating, CVD, and/or other suitable processes.

As discussed below with reference to FIGS. 14B and 14C, in some embodiments, the conductive material may be deposited between a first fin structure 212 and a second fin structure 212 within a dummy region (e.g., a region of the layout of the device 200 without functional devices). The conductive material formed between said first fin structure 212 and the second fin structure 212 in the dummy region may be positioned such that a gate line extending between the two fins is subsequently formed over and adjacent the conductive line 702 as discussed below.

The method 100 then proceeds to block 114 where the previous layers formed between the fins are trimmed and a third dielectric layer may be formed over second dielectric layer and conductive line. In some embodiments, block 114 includes selectively etching the second dielectric layer and/or the conductive line to form an opening in which the third dielectric layer may be formed. Referring to the example of FIG. 8, openings 802 are formed. In some embodiments, the etching process is configured to selectively remove portions of the second dielectric layer 602 and/or the conductive line 702. In some embodiments, the first dielectric layer 502 is not etched. In some embodiments, masking elements are used to protect portions of the device 200 while the etching of the second dielectric 602 and the conductive line 702 may be performed concurrently or separately. The etching process is a dry etching process, a wet etching process, or a combination thereof.

Referring to the example of FIG. 9A, dielectric or capping layer 902 is deposited over the first and second dielectric layers 502 and 602 and in the opening 802. In some embodiments, the capping layer 902 may include a high-k dielectric material, such as a metal oxide. A high-k dielectric material refers to a dielectric material that has a dielectric constant greater than that of silicon dioxide (~3.9). Suitable high-k dielectrics may include hafnium oxide, zirconium oxide, titanium oxide, tantalum oxide, or aluminum oxide. In some embodiments, the capping layer 902 is a same composition as the first dielectric layer 502. In some embodiments, the capping layer 902 may be deposited using CVD, flowable CVD, and/or other suitable deposition method(s), which may be followed by a planarization process, such as a CMP process providing the planar top surface illustrated in FIG. 9A.

The first dielectric layer 502, second dielectric layer 602 and the third dielectric layer 902 form a separation structure also referred to as a dielectric fin 904 between select fin structures. In the illustrated implementation, the dielectric fin 904 is illustrated between fins 212-1 and 212-2 and between fins 212-3 and 212-4.

The third dielectric layer 902 is also formed over the conductive line 702 positioned between select fin structures. The dielectric layer 902 may suitably insulate the conductive line 702 from above structures including, for example, a subsequently formed gate structure.

FIG. 9B illustrates a top view of an embodiment of a portion of the device 200, including fins 212-1 to 212-5, the dielectric fins 904, and the conductive lines 702. The layout of FIG. 9B further illustrates an additional portion of the device 200, which in some embodiments is a second cell substantially similar to that of the device 200 illustrated in FIG. 8. In some embodiments, the cells are SRAM cells. In a further embodiment, the conductive line 702-1 provides a Vdd connection. In a further embodiment, the conductive line 702-2 provides a Vss connection. It is noted that the conductive lines 702 are configured to run parallel to the fin structures 212.

The method 100 may then proceed to block 116 where the method provides a plurality of gate structures over respective channel regions of the fin structures. In an embodiment, the method 100 provides a replacement gate process and the gate structures formed in block 116 are sacrificial or dummy gates that are subsequently replaced by metal gate structures as discussed below with respect to block 130. The dummy gates may be placed over channel region(s) of the fin structures, regions which are interposing two source/drain regions of the fin structures. The dummy gates may protect the channel region of the fin structures while further processing occurs, and then be subsequently replaced by a functional gate as discussed below. Other processes and configurations are also possible however for forming the device 200. Referring to the example of FIG. 10A and 10C, a dummy gate structure 1002 is formed. It is noted that the dummy gate appears out of the plane of the cross-sectional views including provided in FIG. 10B, which is providing the source/drain region of the fin structures 212. Although in some implementations the dummy gates 1002 are shown as a continuous structure that extends lengthwise along the X direction, the dummy gate 1002 may include more than one gate segment.

Each of the dummy gate structures 1002 may include a dummy dielectric layer and a dummy gate electrode. In some embodiments, the dummy gate structure 1002 may be formed by various process steps such as layer deposition, patterning, etching, as well as other suitable processing steps. Exemplary layer deposition processes include low-pressure CVD, CVD, plasma-enhanced CVD (PECVD), PVD, ALD, thermal oxidation, e-beam evaporation, or other suitable deposition techniques, or combinations thereof. The patterning process may include a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. In some embodiments, the dummy dielectric layer may include silicon oxide and the dummy electrode layer may include polycrystalline silicon (polysilicon). The dummy gate structure 1002 may include one or gate spacers may be deposited along its sidewalls.

The method 100 then proceeds to block 118 where the source/drain region(s) of the fin structure(s) are recessed adjacent the dummy gate structure. The fin structure is etched to form a trench or opening in which the source/drain feature, discussed below with reference to block 126, is formed. Referring to the example of FIGS. 10A and 10B, trenches 1004 are formed by recessing the source/drain regions of fin structures 212. The trenches 1004 are annotated 1004-1, 1004-2, 1004-3, 1004-4, and 1004-5 respectively. The trenches 1004 may be formed by a dry etch process and/or other suitable etch process(es). For example, the dry etch process may implement an oxygen-containing gas, hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. During forming the recess of the source/drain region of the fin structures 212, the cladding layer 402 is also removed, in some embodiments concurrently, from the source/drain region of the fin structures 212. The trenches 1004 expose a top surface of the recessed fin structures 212 and adjacent regions of the top surface of the isolation features 203.

Figure 10C:
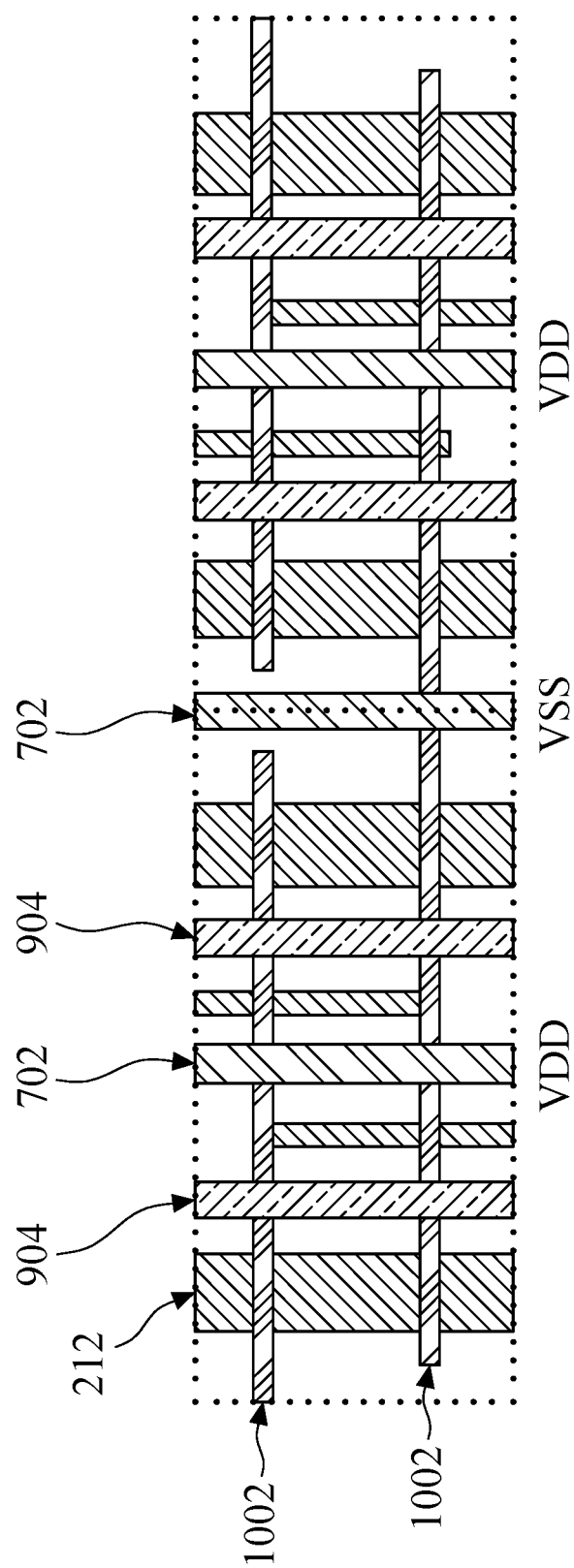
Figure 11:
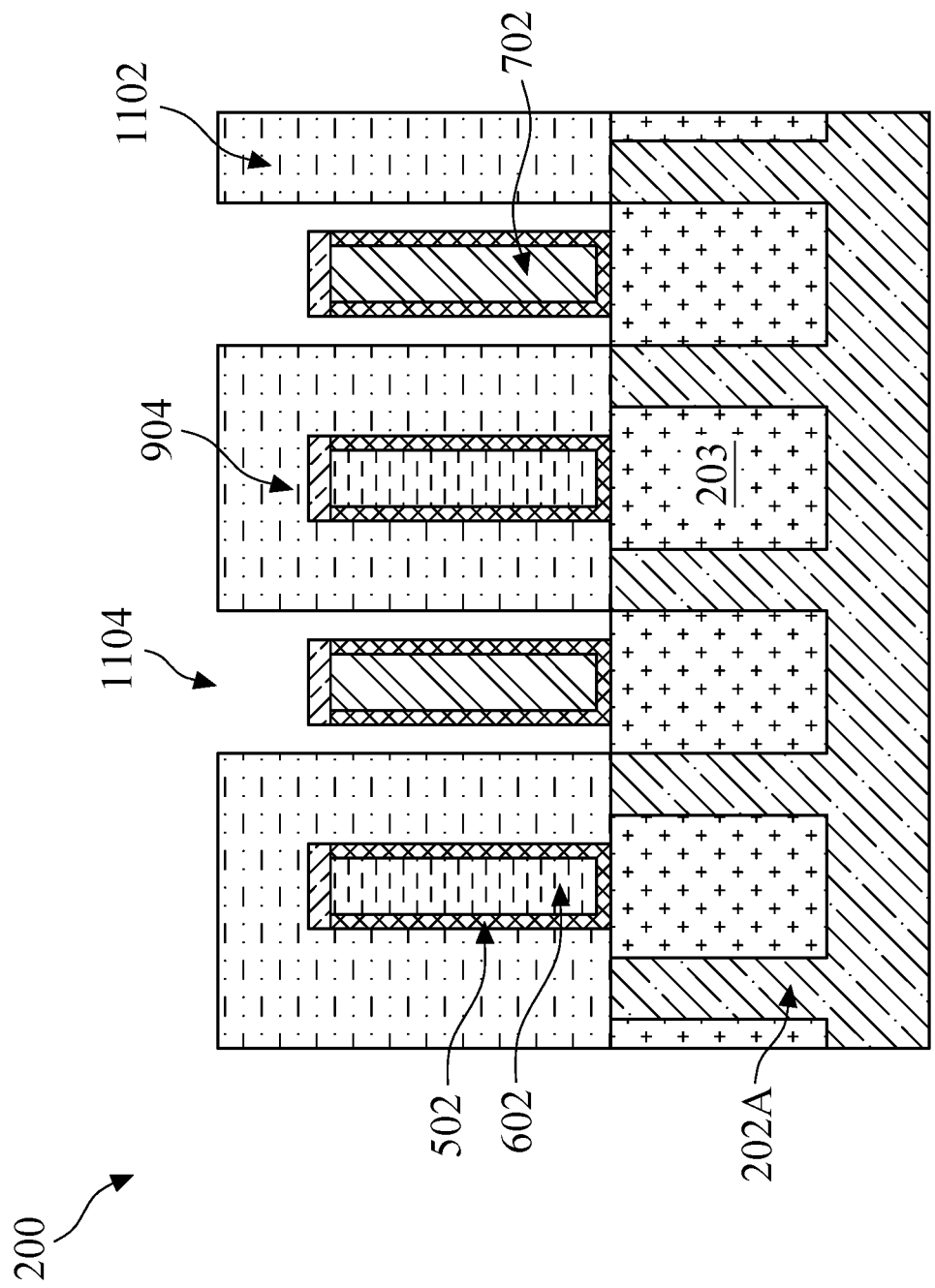

FIG. 10C is illustrative of an embodiment of the device 200 from a top view of its layout. As illustrated, the dummy gate structures 1002 extend perpendicular to the active regions, fin structures 212, and the conductive lines 702.

The method 100 then proceeds to block 120 where a masking element is formed over the device. The masking element may protect regions of the device, while providing an opening or openings over the conductive lines formed above in block 112. Referring to the example of FIG. 11, a masking element 1102 is formed on the device 200 having openings 1104 over the conductive lines 702. The masking element 1102 may be formed by suitable photolithography processes. The photolithography process may include forming a photoresist layer overlying the substrate 202, exposing the photoresist layer to a pattern, performing post-exposure bake processes, and developing the photoresist layer to form a masking element 1102 including the photoresist layer. In some embodiments, the masking element includes a hard mask material. In some embodiments, patterning the photoresist layer to form the masking element may be performed using an electron beam (e-beam) lithography process. The openings 1104 may extend parallel the active regions of fins 212. In some embodiments, the openings 1104 have a width (perpendicular the direction the fins 212 extend, e.g., a width in the x-direction of FIG. 11) that is substantially equal to the width of the isolation feature 203 extending between fin structures 212.

The method 100 then proceeds to block 122 where the first dielectric layer is removed adjacent the conductive line. In some embodiments, the first dielectric layer is removed in the openings provided in the masking element of block 120. The dielectric layer may be removed by a selective etch removing the first dielectric layer, while maintaining the conductive line. In some implementations, this etching provides for selective etching of the first dielectric layer of SiN, SiCN with respect to the conductive material of the conductive line. The etchant may be a suitable nitride etchant such as a carbon-fluorine composition. The etching may be a wet etch, dry etch, and/or other suitable etching processes. In some embodiments, the etching is a combination of a wet etch and a dry etch. Referring to the example of FIG. 12A, the first dielectric layer 502 is removed in the openings 1104 in the masking element 1102. In some embodiments, the dielectric layer 502 is maintained directly under the conductive line 702.

For example, in some embodiments, a residual portion 502' of the first dielectric layer 502 is maintained under the conductive line 702 after the etching process has been completed. This is illustrated by FIG. 12B.

Figure 13C:
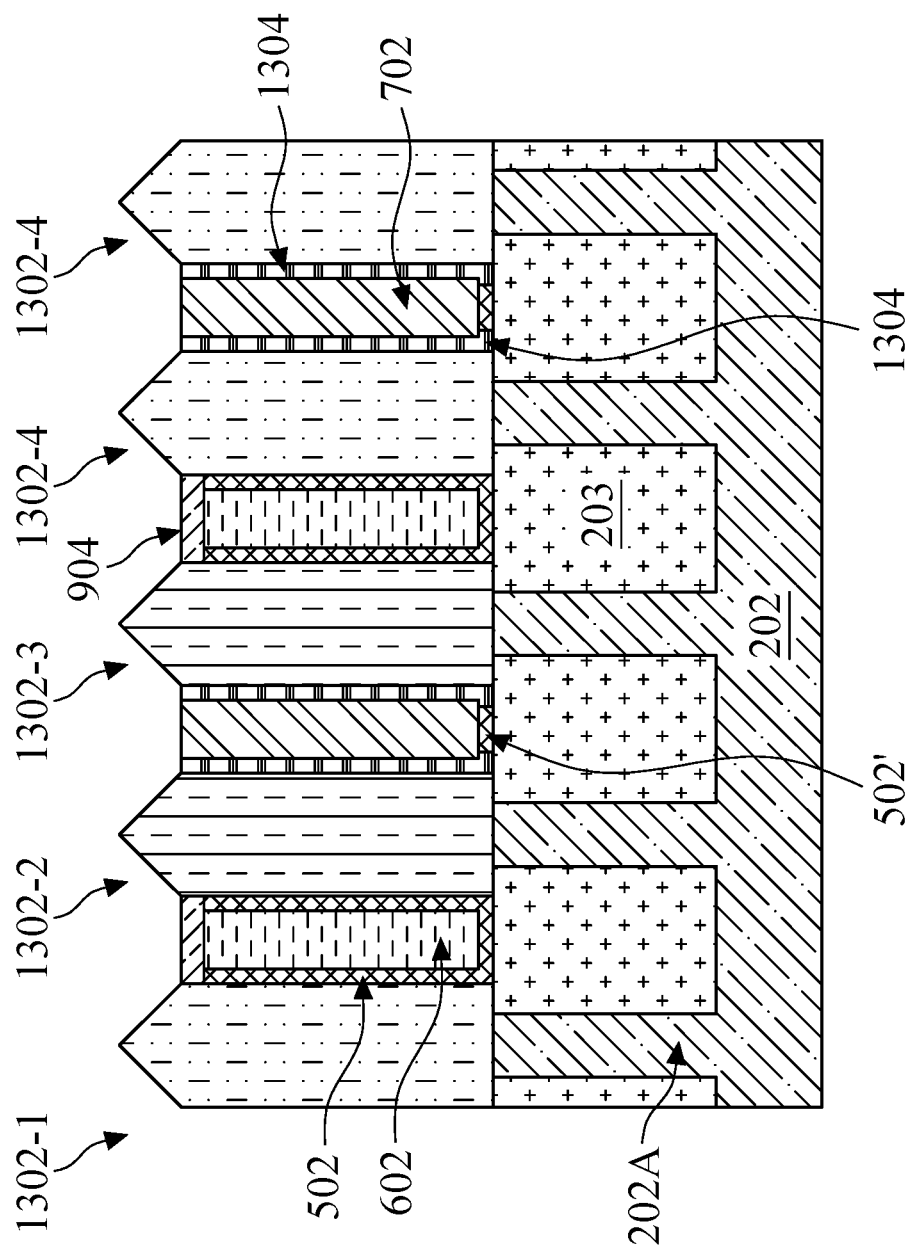

The method 100 then proceeds to block 124 where a conductive liner is formed adjacent the conductive line. In some embodiments, the conductive liner is a silicide layer such as TiSi. In some embodiments, the conductive liner layer may be other conductive compositions. Referring to the example of FIGS. 13A, 13B and 13C, a conductive liner layer 1304 is formed. In some embodiments, the conductive liner layer 1304 may be TiSi. FIG. 13C provides a follow-on embodiment to that of FIG. 12B and the residue portion 502'.

The method 100 then proceeds to block 126 where source and drain features are grown over the recessed fin structures. The source/drain features may be epitaxially grown on a seed area including the top surface of the recessed fin structure. In some embodiments, the epitaxial process may be vapor-phase epitaxy (VPE), ultra-high vacuum CVD (UHV-CVD), molecular beam epitaxy (MBE), and/or other suitable processes. Referring to the example of FIGS. 13A and 13B, source/drain features 1302, annotated as 1302-1, 1302-2, 1302-3, 1302-4, and 1302-5, are formed over the respective recessed fin structures 212. The source/drain features 1302 may be epitaxially grown and suitably doped to provide the relevant type of conductivity (n-type or p-type). In various embodiments, the semiconductor material layer grown to form the source/drain features 1302 may include Ge, Si, GaAs, AlGaAs, SiGe, GaAsP, SiP, SiC, and/or other suitable material. The source/drain features 1302 may be formed by one or more epitaxial processes. In some embodiments, the source/drain features 1302 may be in-situ doped during the epi process. For example, in some embodiments, epitaxially grown SiGe source/drain features may be doped with boron. In some cases, epitaxially grown Si epi source/drain features may be doped with carbon to form Si:C source/drain features, phosphorous to form Si:P source/drain features, or both carbon and phosphorous to form SiCP source/drain features. In some embodiments, the source/drain features 1302 are not in-situ doped, and instead an implantation process is performed to dope the source/drain features 1302. In some embodiments, formation of the source/drain features 1302 may be performed in separate processing sequences for each of N-type and P-type source/drain features.

In an embodiment, the source/drain features 1302-2 and 1302-3 are source/drain features for a first type of device (e.g., PFET). In a further embodiment, the source/drain features 1302-1, 1302-4, and 1302-5 are source/drain features for a second type of device (e.g., NFET). Alternatively, other configurations of device types are possible. Because the certain source/drain features 1302 are different from the other source/drain features 1302, they may be formed separately using a masking layer.

It is noted that in some embodiments, inner spacers are formed adjacent the channel region. For example, using the example of FIG. 10A, the exposed sacrificial layers 206 abutting the trenches 1004 may be slightly recessed and inner spacers (e.g., dielectric material) may be formed (not shown).

In some embodiments, block 124 is performed at least in part after block 126. In some embodiments, the conductive liner layer is a silicide layer formed by the interaction of the semiconductor material of the source/drain features 1302 and the adjacent conductive line 702. For example, in some embodiments, a titanium-containing layer (or other metal) is deposited over the source/drain features 1302. An anneal is formed to provide the silicon titanium compound.

The method 100 then proceeds to block 128 wherein the dummy gate is removed, and the channel layers are released. The method 100 then proceeds to block 128 where the dummy gate(s) are removed and the channel layers of the stack are released in the channel region of the fin structure(s). The dummy gate removal and/or channel layer release may include one or more etching steps. In some embodiments, the selective wet etching includes an APM etch (e.g., ammonia hydroxide-hydrogen peroxide-water mixture). In some embodiments, the sacrificial layers 206 and the cladding layer 402 are formed of silicon germanium, the selective removal includes silicon germanium oxidation followed by a silicon germanium oxide removal. For example, the oxidation may be provided by ozone clean and then silicon germanium oxide removed by an etchant such as NH$_4$OH.

The method 100 then proceeds to block 130 where the metal gate structure is formed. The metal gate structure is formed over the channel region(s) of the fin structures. Referring to the example of FIGS. 14A and 14B, a metal gate structure 1400 is formed over the device.

Figure 14B:
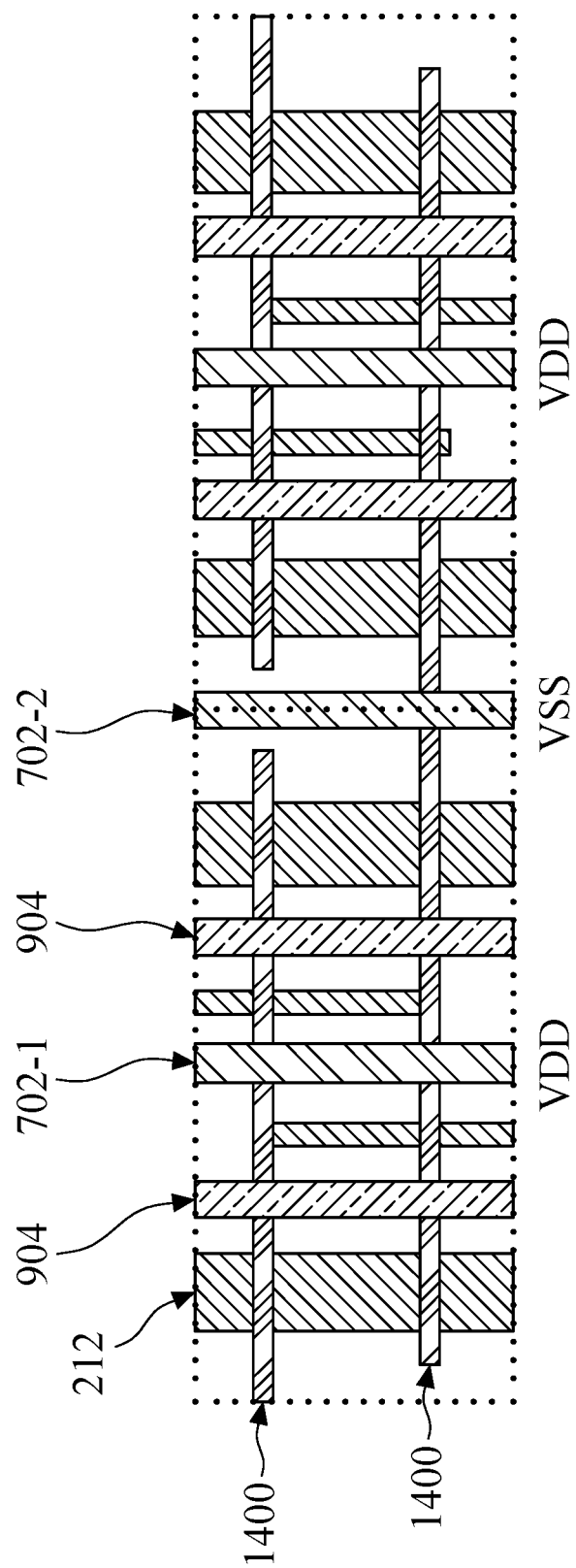

Referring to the example of FIGS. 14A and 14B, metal gate structures 1400 are formed over the channel regions of the fin structures 212, replacing the dummy gate structure 1002.

In some embodiments, the metal gate structure includes a gate dielectric layer and a gate electrode formed over the gate dielectric layer. In some embodiments, the gate dielectric layer may include an interfacial layer and a high-k dielectric layer. High-K gate dielectrics, as used and described herein, include dielectric materials having a high dielectric constant, for example, greater than that of thermal silicon oxide (~3.9). The interfacial layer may include a dielectric material such as silicon oxide, hafnium silicate, or silicon oxynitride. The interfacial layer may be deposited using chemical oxidation, thermal oxidation, atomic layer deposition (ALD), chemical vapor deposition (CVD), and/or other suitable method. The high-K dielectric layer may include a high-K dielectric layer such as hafnium oxide. Alternatively, the high-K dielectric layer may include other high-K dielectrics, such as hafnium oxide (HfO), titanium oxide (TiO$_2$), hafnium zirconium oxide (HfZrO), tantalum oxide (Ta$_2$O$_5$), hafnium silicon oxide (HfSiO$_4$), zirconium oxide (ZrO$_2$), zirconium silicon oxide (ZrSiO$_2$), lanthanum oxide (La$_2$O$_3$), aluminum oxide (Al$_2$O$_3$), zirconium oxide (ZrO), yttrium oxide (Y$_2$O$_3$), SrTiO$_3$ (STO), BaTiO$_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), (Ba,Sr)TiO$_3$ (BST), silicon nitride (SiN), silicon oxynitride (SiON), combinations thereof, or other suitable material. The high-K dielectric layer may be formed by ALD, physical vapor deposition (PVD), CVD, oxidation, and/or other suitable methods.

The gate electrode of the metal gate structure 1400 may include a multi-layer structure, such as various combinations of a metal layer with a selected work function to enhance the device performance (work function metal layer), a liner layer, a wetting layer, an adhesion layer, a metal alloy or a metal silicide. By way of example, the gate electrode may titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof. In various embodiments, the gate electrode of the gate structure may be formed by ALD, PVD, CVD, e-beam evaporation, or other suitable process. In various embodiments, a planarization process, such as a CMP process, may be performed to remove excessive materials to provide a substantially planar top surface of the gate structures. Certain of the metal gate structures are coupled together. The dielectric fin 904 may act as a separation structure between adjacent metal gate structures. This is also illustrated in cross-sectional view of FIG. 15A. The conductive line 702 may be insulated from the metal gate structure 1400 including for example, by the dielectric layer 902.

Figure 15B:
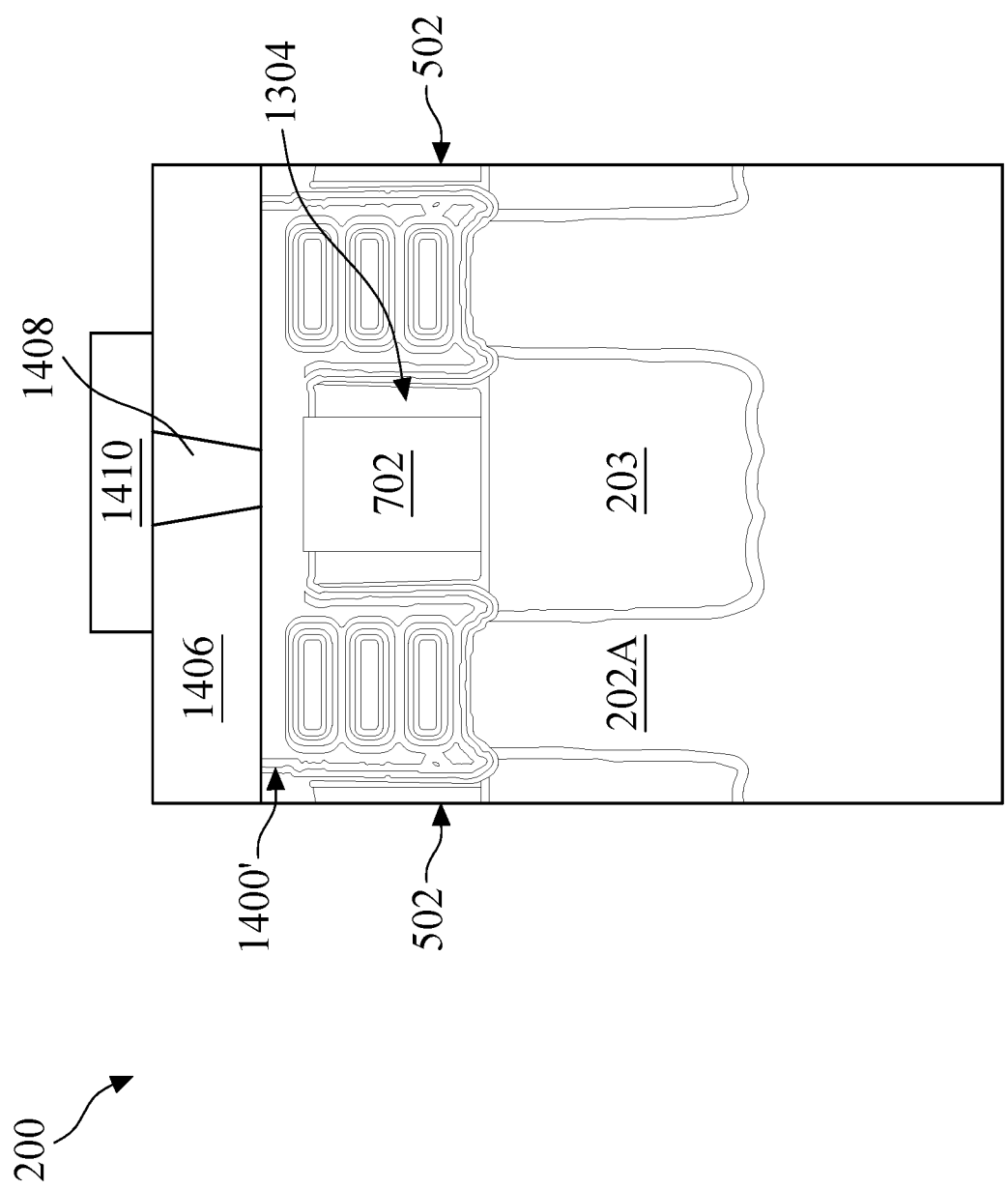
Figure 15C:
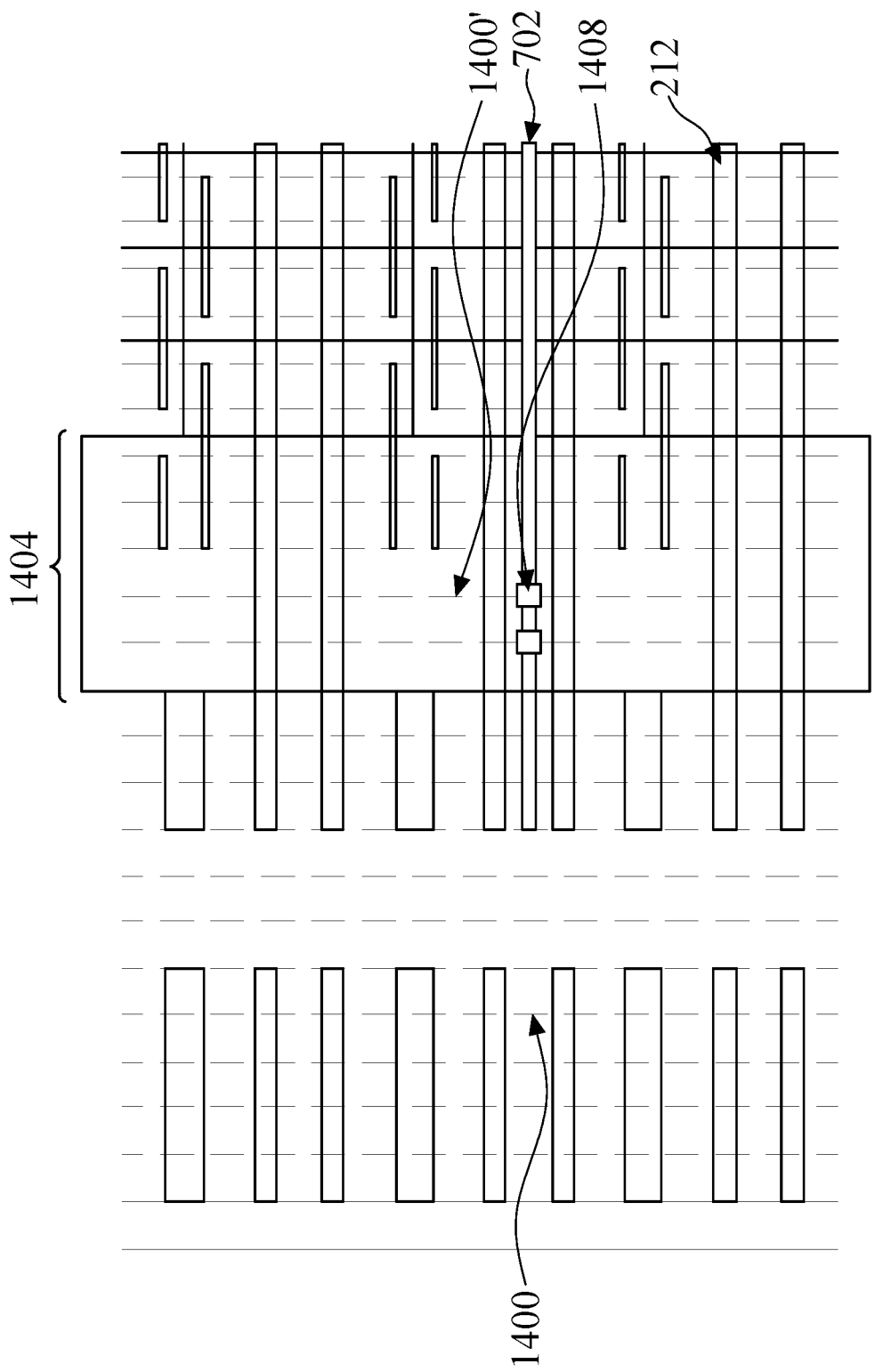

In some embodiments, a dummy region of the device, where the gate structures are not functional gates of the resultant IC including device 200, the gate structures 1400' may be formed adjacent the conductive line 702. FIG. 15B is illustrative of certain gate structures that may be formed with the conductive line 702 interposing the gates and electrically coupled to the gates. FIG. 15C illustrates a top view of a layout of a dummy area 1404 including gate structures 1400'. The gate structures 1400' may interface with the conductive line 702. In an embodiment, a via 1408 is formed to the gate structures 1400' and thus, the conductive line 702. In some embodiments, the conductive line 702 here provides a power line or routing of a portion of a power line such as Vss or Vdd.

The configuration illustrated in FIG. 15B having the gate structure 1400' extending from one fin to another fin with the conductive line 702 interposing the two fins (i.e., the top region coupling two gate structures extending over the conductive line 702) may be provided on the same fins 212 where the source/drain regions abut the conductive line (i.e., fins 212-2 and 212-3, or 212-4 and 212-5) or may be a different portion of the device 200.

The method 100 then proceeds to block 132 where further processing is performed. Such further processes may include, for example, deposition of additional contact etch stop layers (CESL), deposition of additional interlayer dielectric (ILD) layers, and overlying conductive features such as contact vias and metallization lines. In some embodiments, the middle CESL is illustrated by dielectric layer(s) 1406 of FIG. 15A, 15B. The CESL may include silicon nitride, silicon oxide, silicon oxynitride, and/or other materials known in the art. The CESL 1406 may be deposited using ALD, plasma-enhanced chemical vapor deposition (PECVD) process and/or other suitable deposition or oxidation processes. In some embodiments, an ILD layer may be deposited over the CESL including adjacent the metallization 1410 of FIG. 15B. In some embodiments, the ILD layer includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. Contact features may be provided through the dielectric layer(s) in subsequent processing including contact features including contact via 1408 of FIGS. 15A and 15B. The via 1408 interconnects to a metallization 1410, which may be referred to as M0.

It is noted that in the embodiment of the method 100 discussed above, the conductive line 702 is formed prior to the formation of the source/drain features. Alternatively, in some implementations, a dielectric fin 904 may be formed between each of the source/drain features 1302, including between, for example, features 1302-2 and 1302-3. After growth of the source/drain features, a masking element is formed to provide an opening over certain of the dielectric fins 904 disposed between source/drain features 1302 such as an opening between source/drain feature 1302-2 and 1302-3 and well as an opening over source/drain feature 1302-4 and source/drain feature 1302-5. The dielectric fin 904 is then removed from these regions, and a conductive line 702 substantially similar to conductive line 702 and conductive liner layer 1304 is formed in the opening provided by the removal of the dielectric fin 904. In some implementations, the resulting device is substantially similar to that of FIG. 13A and the method continues therefrom.

Figure 16:
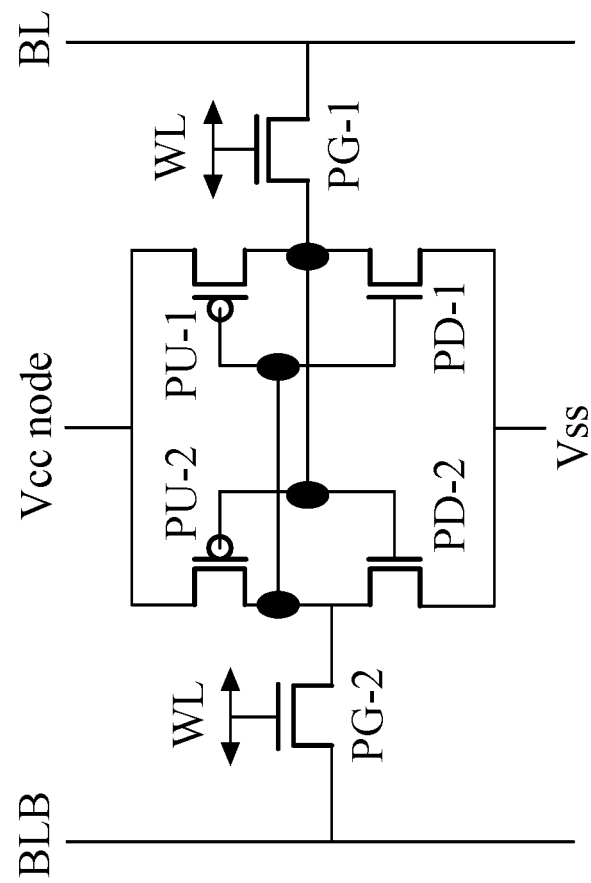
FIG. 16 illustrates a schematic of a device that may in some embodiments be implemented using aspects of the present disclosure.

In some embodiments, the conductive layer(s) 702 discussed above provide for signal or power lines of an IC or portion thereof. The exact functionality of the semiconductor device 200 is not a limitation to the now described subject matter beyond what is specifically recited in the claims that follow. However, as one example, in certain implementations, the conductive lines 702 may provide for lines associated with an SRAM device. For example, in one implementations, the semiconductor device 200 includes an SRAM, which includes many SRAM cells, such as six-transistor (6T) single port (SP) SRAM cell 1600 shown in FIG. 16. Referring to FIG. 16, the 6T SP SRAM cell 1600 includes two PMOSFET (such as p-type FinFETs or p-type GAA transistors discussed above) as pull-up transistors, PU-1 and PU-2; two NMOSFET (such as n-type FinFETs or n-type GAA transistors discussed above) as pull-down transistors, PD-1 and PD-2; and two NMOSFET (such as n-type FinFETs or n-type GAA transistors) as pass-gate transistors, PG-1 and PG-2. The PU-1 and PD-1 are coupled to form an inverter. The PU-2 and PD-2 are coupled to form another inverter. The two inverters are cross-coupled to form a storage unit. FIG. 16 further shows word line (WL), bit line (BL), and bit line bar (BLB) for accessing the storage unit of the SRAM cell 1600. Power lines Vss and Vdd (Vcc) are also illustrated. In an embodiment, the PD-1 and PD-2 transistors are formed including active regions of the fins 212-4 and 212-5 respectively. In an embodiment, the PD-1 and PD-2 transistors are coupled to Vss, for example, in some implementations, conductive line 702 such as conductive line 702-2. In an embodiment, the PU-1 and PU-2 transistors including having active regions of the fins 212-2 and 212-3 respectively. In an embodiment, the PU-1 and PU-2 transistors are coupled to Vcc/Vdd, for example, in some implementations, conductive line 702-1.

The embodiments above discuss forming a metallization line that can be used for Vcc or Vdd connection. However, as illustrated in FIG. 16, devices such as the SRAM 1600 have additional signal lines. In certain designs, other lines may also be formed using the methods and structures above including but not limited to bit lines. For example, if a signal line is to run parallel to an active region (e.g., fin structure), it is suitable for providing the metallization embedded between active regions such as provided herein. Further, the SRAM implementation is exemplary only and other device types may be suitable.

In one exemplary aspect, the present disclosure is directed to a semiconductor device. The device includes a first fin structure, a second fin structure, and a third fin structure extending from a substrate. A first source/drain feature is formed over the first fin structure. A second source/drain feature is formed over the second fin structure. A third source/drain feature is formed over the third fin structure. A dielectric separation structure extends between the first source/drain feature and the second source/drain feature. A conductive line is disposed between the second source/drain feature and the third source/drain feature.

In a further embodiment, a first shallow trench isolation (STI) feature is provided between the first fin structure and the second fin structure. A second STI feature extends between the second fin structure and the third fin structure. In an embodiment, a dielectric separation structure is disposed over the first STI feature. In an embodiment, a conductive line is disposed over the second STI feature. In some implementations, the first source/drain feature is of a first conductivity type and the second source/drain feature and third source/drain feature are of a second conductivity type.

In an embodiment, the conductive line extends parallel to each of the first, second and third fin structures. In some implementations, the conductive line includes a conductive liner layer. The conductive liner layer may be a silicide composition. In an embodiment, a metal gate structure is formed over at least two of the first, second and third fin structures, the metal gate structure may extend over the conductive line.

In another of the broader embodiments, a semiconductor device includes a memory cell having a first transistor and a second transistor. A first source/drain feature of the first transistor are formed over a recessed first fin structure. A second source/drain feature of the second transistor is formed over a recessed second fin structure. A power line is disposed between the first source/drain feature and the second source/drain feature.

In some implementations, the first source/drain feature and the second source/drain feature each include epitaxially grown silicon. In an embodiment, the first transistor and the second transistor are of a same conductivity type (e.g., one of n-type or p-type.) In an embodiment, the power line carries Vcc. In an embodiment, the power line carries Vss. In some implementations, the device further includes a dummy region having a first dummy gate and a second dummy gate connected to the first dummy gate and another power line disposed between the first dummy gate and the second dummy gate.

In another of the embodiments discussed herein, provided is a method that includes providing a first fin structure, a second fin structure, and a third fin structure disposed over a substrate. A dielectric fin is formed between the first fin structure and the second fin structure. A conductive line is formed between the second fin structure and the third fin structure. The method includes forming a gate structure extending over the second fin structure, the conductive line and the third fin structure. A source/drain region are recessed into each of the first, second and third fin structures. A first, second and third source/drain feature are epitaxially grown on the first, second, and third fin structures respectively.

In a further embodiment, after the epitaxially growing portion of the method, the gate structure is removed and a metal gate structure is formed. In an embodiment, forming the dielectric fin includes: depositing a first dielectric layer; depositing a second dielectric layer; etching back a portion of the second dielectric layer; and depositing a high-k dielectric layer over the first dielectric layer and second dielectric layer.

In some embodiments, the method further includes forming shallow trench isolation (STI) features between the first fin structure and the second fin structure and between the second fin structure and the third fin structure. The dielectric fin may be formed over one of the STI features and the conductive line is formed over another of the STI features. In some implementations, the method includes after forming the gate structure, forming a silicide layer between the conductive line and the epitaxially grown second source/drain feature.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a first fin structure, a second fin structure, and a third fin structure extending from a substrate;
    a first source/drain feature over the first fin structure;
    a second source/drain feature over the second fin structure;
    a third source/drain feature over the third fin structure;
    a dielectric separation structure extending between the first source/drain feature and the second source/drain feature;
    a conductive line between the second source/drain feature and the third source/drain feature: and
    a metal gate structure over at least two of the first, second and third fin structures, wherein the metal gate structure extends over the conductive line.

2. The semiconductor device of claim 1, further comprising:
    a first shallow trench isolation (STI) feature between the first fin structure and the second fin structure; and
    a second STI feature extending between the second fin structure and the third fin structure.

3. The semiconductor device of claim 2, wherein the dielectric separation structure is disposed over the first STI feature.

4. The semiconductor device of claim 2, wherein the conductive line is disposed over the second STI feature.

5. The semiconductor device of claim 1, wherein the first source/drain feature is of a first conductivity type and the second source/drain feature and third source/drain feature are of a second conductivity type.

6. The semiconductor device of claim 1, wherein the conductive line extends parallel each of the first, second and third fin structures.

7. The semiconductor device of claim 6, wherein the conductive line includes a conductive liner layer.

8. The semiconductor device of claim 7, wherein the conductive liner layer is a silicide composition.

9. The semiconductor device of claim 1, wherein the second fin structure is an active region for a first type of transistor and the third fin structure is an active region for the first type of transistor.

10. A semiconductor device, comprising:
    a memory cell having a first transistor and a second transistor;
    a first source/drain feature of the first transistor formed over a recessed first fin structure, a second source/drain feature of the second transistor formed over a recessed second fin structure; and
    a power line disposed between the first source/drain feature and the second source/drain feature:, a dummy region having a first dummy gate and a second dummy gate connected to the first dummy gate; and
    another power line disposed between the first dummy gate and the second dummy gate.

11. The semiconductor device of claim 10, wherein the first source/drain feature and the second source/drain feature each include epitaxially grown silicon.

12. The semiconductor device of claim 10, wherein the first transistor and the second transistor are of a same conductivity type, wherein the same conductivity type is one of n-type or p-type.

13. The semiconductor device of claim 10, wherein the power line carries Vcc.

14. The semiconductor device of claim 10, wherein the power line carries Vss.

15. The semiconductor device of claim 10, further comprising:
    a wherein the dummy region having a first dummy gate and the second dummy gate are nonfunctional gates of the semiconductor device connected to the first dummy gate; and
    another power line disposed between the first dummy gate and the second dummy gate.

16. A method, comprising:
    providing a first fin structure, a second fin structure, and a third fin structure disposed over a substrate;
    forming a dielectric fin between the first fin structure and the second fin structure;
    forming a conductive line between the second fin structure and the third fin structure;
    forming a gate structure extending over the second fin structure, the conductive line and the third fin structure;
    recessing a source/drain region of each of the first, second and third fin structures; and
    epitaxially growing a first, second and third source/drain feature on the first, second, and third fin structures respectively.

17. The method of claim 16, further comprising:
    after the epitaxially growing, removing the gate structure and forming a metal gate structure.

18. The method of claim 16, wherein the forming the dielectric fin includes:
- depositing a first dielectric layer;
- depositing a second dielectric layer;
- etching back a portion of the second dielectric layer; and
- depositing a high-k dielectric layer over the first dielectric layer and second dielectric layer.

19. The method of claim 16, further comprising:
- forming shallow trench isolation (STI) features between the first fin structure and the second fin structure and between the second fin structure and the third fin structure, wherein the dielectric fin is formed over one of the STI features and the conductive line is formed over another of the STI features.

20. The method of claim 16, further comprising:
- after forming the gate structure, forming a silicide layer between the conductive line and the epitaxially grown second source/drain feature.

\* \* \* \* \*